United States Patent
Ries et al.

(10) Patent No.: US 6,596,095 B2
(45) Date of Patent: Jul. 22, 2003

(54) EPITAXIAL SILICON WAFER FREE FROM AUTODOPING AND BACKSIDE HALO AND A METHOD AND APPARATUS FOR THE PREPARATION THEREOF

(75) Inventors: Michael J. Ries, St. Charles, MO (US); Charles Chiun-Chieh Yang, St. Peters, MO (US); Robert W. Standley, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/752,222

(22) Filed: Dec. 29, 2000

(65) Prior Publication Data

US 2001/0037761 A1 Nov. 8, 2001

Related U.S. Application Data

(63) Continuation-in-part of application No. 09/566,890, filed on May 8, 2000, now Pat. No. 6,444,027.

(51) Int. Cl.[7] ............................................... C30B 29/06
(52) U.S. Cl. ........................ 148/33.1; 117/89; 117/94; 117/95; 117/935; 427/700
(58) Field of Search .................. 427/700; 117/89, 117/94, 95, 935; 148/33.1

(56) References Cited

U.S. PATENT DOCUMENTS

| | | |
|---|---|---|
| 4,322,592 A | 3/1982 | Martin |
| 4,496,609 A | 1/1985 | McNeilly et al. |
| 5,192,371 A | 3/1993 | Shuto et al. |
| 5,200,157 A | 4/1993 | Toya et al. |
| 5,242,501 A | 9/1993 | McDiarmid |
| 5,679,405 A | 10/1997 | Thomas et al. |
| 5,769,942 A | 6/1998 | Maeda |
| 5,904,769 A | 5/1999 | Ohashi et al. |
| 5,960,555 A | 10/1999 | Deaton et al. |
| 6,129,047 A | 10/2000 | Nakamura |

FOREIGN PATENT DOCUMENTS

| | | |
|---|---|---|
| EP | 784106 A | 7/1997 |
| EP | 792954 A | 9/1997 |
| EP | 825279 A | 2/1998 |
| EP | 1 043 764 A1 | 10/2000 |
| GB | 2181460 A | 4/1987 |
| JP | 58-130518 J | 8/1983 |
| JP | 06-163238 | 1/1996 |
| JP | 10144697 | 5/1998 |
| JP | 10-223545 A | 8/1998 |
| JP | 11-16844 A | 1/1999 |
| JP | 11087250 | 3/1999 |
| WO | 00 22198 A | 4/2000 |
| WO | 00 34999 A | 6/2000 |

*Primary Examiner*—Robert Kunemund
(74) *Attorney, Agent, or Firm*—Senniger, Powers, Leavitt & Roedel

(57) ABSTRACT

A single crystal silicon wafer with a back surface free of an oxide seal and substantially free of a chemical vapor deposition process induced halo and an epitaxial silicon layer on the front surface, the epitaxial layer is characterized by an axially symmetric region extending radially outwardly from the central axis of the wafer toward the circumferential edge of the wafer having a substantially uniform resistivity, the radius of the axially symmetric region being at least about 80% of the length of the radius of the wafer.

35 Claims, 16 Drawing Sheets

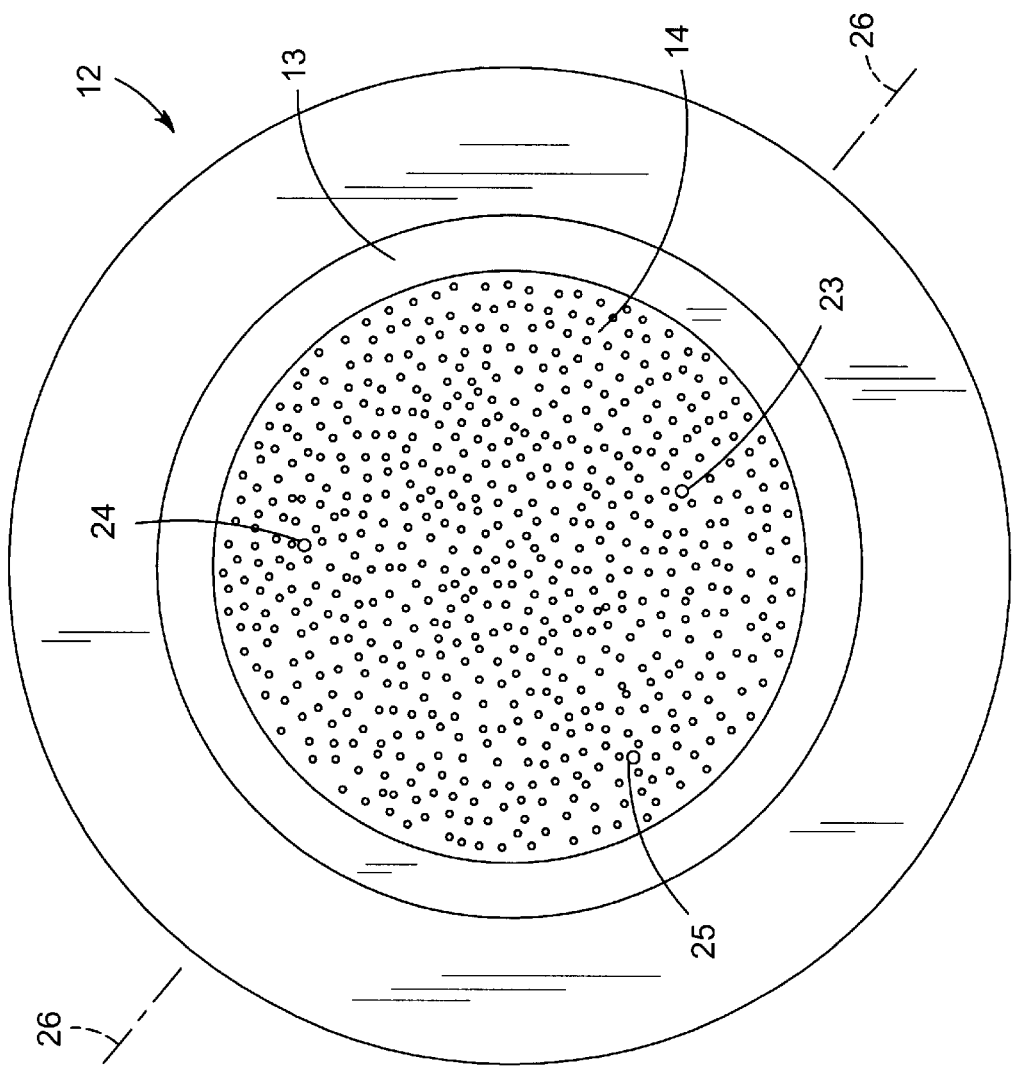

HAZE (DNN)

HAZE (DNN)

EPITAXIAL SILICON WAFER FREE FROM AUTODOPING AND BACKSIDE HALO AND A METHOD AND APPARATUS FOR THE PREPARATION THEREOF

CROSS-REFERENCE TO RELATED APPLICATION

This is a continuation-in-part of U.S. patent application Ser. No. 09/566,890, filed on May 8, 2000, now U.S. Pat. No. 6,444,027.

BACKGROUND OF THE INVENTION

The present invention generally relates to the preparation of semiconductor material substrates, especially silicon wafers, which are used in the manufacture of electronic components. More particularly, the present invention relates to a single crystal silicon wafer comprising an epitaxial silicon layer with reduced autodoping and a back surface that is free of halo.

In the production of single silicon crystals grown by the Czochralski method, polycrystalline silicon is first melted within a quartz crucible with or without dopant. After the polycrystalline silicon has melted and the temperature equilibrated, a seed crystal is dipped into the melt and subsequently extracted to form a single crystal silicon ingot while the quartz crucible is rotated. The single crystal silicon ingot is subsequently sliced into individual silicon wafers which are subjected to several processing steps including lapping/grinding, etching, and polishing to produce a finished silicon wafer having a front surface with specular gloss. In addition to polishing the front surface, many device manufacturers also request a polished back surface with a specular gloss (such wafers are commonly referred to as "double-side polished"). To prepare the finished wafer for device manufacturing, the wafer may be subjected to a chemical vapor deposition process such as an epitaxial deposition process to grow a thin layer of silicon generally between about 0.1 $\mu$m and about 200 $\mu$m thick on the front surface of the wafer such that devices can be fabricated directly on the epitaxial layer. Conventional epitaxial deposition processes are disclosed in U.S. Pat. Nos. 5,904,769 and 5,769,942.

The epitaxial deposition process is typically comprised of two steps. In the first step after the silicon wafer is loaded into a deposition chamber and lowered onto a susceptor, the front surface of the wafer is subjected to a cleaning gas such as hydrogen or a hydrogen/hydrochloric acid mixture at about 1150° C. to "pre-bake" and clean the front surface of the silicon wafer and remove any native oxide on that surface to allow the epitaxial silicon layer to grow continuously and evenly onto the front surface. In the second step of the epitaxial deposition process the front surface of the wafer is subjected to a vaporous silicon source such as silane or trichlorosilane at about 800° C. or higher to deposit and grow an epitaxial layer of silicon on the front surface. During both steps of the epitaxial deposition process the silicon wafer is supported in the epitaxial deposition chamber by the susceptor which is generally rotated during the process to ensure even growth of the epitaxial layer. The susceptor is generally comprised of high purity graphite and has a silicon carbide layer completely covering the graphite to reduce the amount of contaminants such as iron released from the graphite into the surrounding ambient during high temperature processes. Conventional susceptors used in epitaxial growth processes are well known in the art and described in U.S. Pat. Nos. 4,322,592, 4,496,609, 5,200,157, and 5,242,501.

During the loading process, gas can be trapped between a conventional susceptor and the wafer as the wafer is lowered onto the susceptor causing the wafer to "float" and slide onto the susceptor in a position that is not intended (e.g., partly out of the recessed "pocket"). This can result in uneven epitaxial growth. Furthermore, during the pre-bake step a small amount of cleaning gas such as hydrogen can effuse around the wafer edge between the wafer and the susceptor and into the space between the wafer and the susceptor. If the back surface of the wafer is sealed with an oxide layer (typically about 3000 Å to about 5500 Å thick), the effused hydrogen will not react sufficiently with the oxide layer to create pinholes in the layer or completely remove the oxide layer. If the back surface is an etched or polished surface as desired by many device manufacturers and only has a thin native oxide layer (typically about 15 Å to about 30 Å), the hydrogen or hydrogen/hydrochloric acid mixture will typically completely remove the native oxide layer near the outer edge of the back surface where the cleaning gas effuses around the wafer and create pinhole openings in the native oxide layer exposing the silicon surface as etching moves inward from the outer edge of the wafer. These pinhole openings typically form in an annular region inward of the circumferential edge of the wafer.

During the epitaxial deposition process a small amount of silicon containing source gas can also effuse around the wafer edge between the wafer and the susceptor and into space between the wafer and the susceptor. If the back surface of the wafer is oxide sealed, nucleation and growth of a silicon film is substantially suppressed. In areas where the native oxide layer has been completely etched away by the cleaning gas a smooth continuous layer of silicon is grown. However, in areas where the cleaning gas has not completely removed the native oxide layer, pinholes in the native oxide layer expose the silicon wafer and allow the silicon containing source gas to deposit silicon in the pinholes and create a nonuniform silicon film on the wafer backside during the epitaxial deposition. Thus, for wafers with etched or polished back surfaces having only a native oxide layer, pinholes created in the native oxide layer during the pre-bake step may lead to discontinuous silicon growth on the back surface which appears hazy under bright light illumination. This haziness or "halo" on the back surface of the wafer is comprised of small silicon growths or bumps having a diameter of about 0.5 $\mu$m and being about 10 nm high. These bumps of silicon scatter light and lead to haziness and can be deemed undesirable as they can interfere with machine vision and optical pyrometry systems that view the back surface of the wafer during device processing. The halo is particularly visible to the eye under bright light and by laser surface scanners on the specular glossy back surface of a double side polished wafer (see FIG. 12A). In contrast, the relatively rough back surface of a single side polished wafer results in a significant degree of diffuse scattering of reflected light which reduces the appearance of halo.

Another problem encountered during the high temperature growth of the epitaxial silicon layer is the out-diffusion of dopant atoms such as boron or phosphorus through the back surface of the silicon wafer during the high temperature pre-bake and the epitaxial growth steps. With conventional susceptors, the dopant atoms that out-diffuse from the back surface can effuse between the wafer edge and the susceptor toward the front surface of the wafer. These dopant atoms can be incorporated into and contaminate the growing deposition layer and degrade the resistivity uniformity near the wafer edge. If the back surface of the silicon wafer is oxide sealed, the dopant atoms will not substantially outdiffuse from the back surface. Silicon wafers having etched or polished back surfaces, however, are subject to out-diffusion of dopant atoms from the back surface during the epitaxial deposition process which can lead to unwanted autodoping of the front surface.

Several methods have been suggested for attempting to eliminate back surface halos and autodoping. To eliminate back surface halos Nakamura (Japanese Unexamined Patent Application No. JP11-16844) disclosed performing a hydrogen fluoride strip and/or a high-temperature hydrogen annealing step of the back surface up to 10 days before the wafers are loaded into the epitaxial reactor. The process adds additional processing steps which can greatly increase complexity and cost of the deposition process. Deaton et al. (U.S. Pat. No. 5,960,555) disclosed a method of preventing the frontside reactive source gas from effusing to the wafer backside by utilizing a susceptor with built-in channels along the wafer edge for directing purge gas flows to the edge of the wafer. This process requires substantial modification of existing epitaxial deposition chambers and utilizes increased purge gas flows which can cause the purge gas to spill over to the front surface and mix with the source gas which can degrade the resulting epitaxial film.

To reduce autodoping, Hoshi (Japanese Unexamined Patent Application No. JP11-87250) disclosed using vacuum sucking on the edge of a susceptor to evacuate boron dopant on the edge of the susceptor and prevent autodoping. This process may affect wafer edge uniformity and thickness and requires substantial modification to existing epitaxial deposition systems. Nakamura (Japanese Unexamined Patent Application JP10-223545) disclosed a modified susceptor having slots on the edge of the susceptor such that the out-diffused dopant atoms would be pushed down through the slots and into the exhaust. This method also allows a substantial amount of the deposition gas to be evacuated below the back surface of the wafer which can lead to the halo affect previously discussed as well as premature corrosion of the exhaust system and safety concerns.

To date, therefore, methods of controlling the halo effect on the back surface of silicon wafers and autodoping problems associated with dopant out-diffusion from the back surface during an epitaxial deposition process have not been satisfactory. As such, a need exists in the semiconductor industry for a simple, cost effective approach to solving the halo effect and unwanted autodoping of the front surface of a silicon wafer during an epitaxial deposition process.

SUMMARY OF THE INVENTION

Among the objects of the present invention, therefore, is the provision of a single crystal silicon wafer which (a) has an epitaxial surface that is essentially unaffected by gas-phase autodoping; and (b) has a back surface free from halo.

Briefly, therefore, the present invention is directed to a single crystal silicon wafer comprising a silicon wafer substrate having a central axis, a front surface and a back surface which are generally perpendicular to the central axis, a circumferential edge, and a radius extending from the central axis to the circumferential edge of the wafer. The back surface of the wafer is free of an oxide seal and substantially free of a chemical vapor deposition process induced halo. Additionally, the silicon wafer substrate comprises P-type or N-type dopant atoms. The single crystal silicon wafer further comprises an epitaxial silicon layer on the front surface of the silicon wafer substrate. The epitaxial silicon layer is characterized by an axially symmetric region extending radially outwardly from the central axis toward the circumferential edge wherein the resistivity is substantially uniform. The radius of the axially symmetric region is at least about 80% of the length of the radius of the substrate. The epitaxial silicon layer also comprises P-type or N-type dopant atoms.

This invention is also directed to a process for growing an epitaxial silicon layer on a silicon wafer substrate in a chemical vapor deposition chamber. The process comprises contacting the front surface of the silicon wafer substrate and substantially the entire back surface of the silicon wafer substrate with a cleaning gas to remove an oxide layer from the front surface and the back surface of the silicon wafer substrate. After the oxide layer is removed, the epitaxial layer is grown on the front surface of the silicon wafer substrate. During the growth of the epitaxial layer, a purge gas is introduced into the the chemical vapor deposition chamber to reduce the number of out-diffused dopant atoms from the back surface of the silicon wafer substrate incorporated in the epitaxial silicon layer.

This invention is also directed to an apparatus for the support of a silicon wafer during the growth of an epitaxial silicon layer via a chemical vapor deposition process. The apparatus comprises a susceptor sized and configured for supporting the silicon wafer thereon. The susceptor has a surface with a density of openings between about 0.2 openings/cm$^2$ and about 4 openings/cm$^2$ which is in a generally parallel opposed relationship with the silicon wafer. The openings permit fluid flow through the surface for fluid contact with the back surface of the silicon wafer.

This invention is also directed to an apparatus for use in an epitaxial deposition process wherein an epitaxial silicon layer is grown on a silicon wafer substrate with a front surface and a back surface. The apparatus comprises a chamber, a wafer support device for supporting the silicon wafer substrate and rotatable means for supporting the wafer support device and the silicon wafer substrate. The wafer support device permits fluid contact with the front surface of the silicon wafer substrate and substantially the entire back surface of the silicon wafer substrate. The apparatus further comprises a heating element, a gas inlet for allowing cleaning gas, source gas and purge gas to enter the apparatus and a gas outlet for allowing the foregoing gases to exit the apparatus.

Other objects and features of this invention will be in part apparent and in part pointed out hereinafter.

BRIEF DESCRIPTION OF THE DRAWINGS

FIG. 3 is a top view of an embodiment of the wafer support device of the present invention.

FIG. 12 contains two haze maps that compare the degree of halo on the back surface of epitaxial wafers.

FIG. 13 contains surface nanotopography maps that compare the nanotopography of the front surface of epitaxial wafers.

Corresponding reference characters indicate corresponding parts throughout the drawings.

DETAILED DESCRIPTION OF THE PREFERRED EMBODIMENTS

In accordance with the present invention, a single crystal silicon wafer comprising a front surface having an epitaxial silicon layer deposited thereon that is substantially free of autodoping and a back surface free of an oxide seal and halo has been developed.

A. Silicon Wafer Substrate

The starting material for the present invention preferably is a single crystal silicon wafer substrate which has been sliced from a single crystal ingot grown in accordance with any of the conventional variations of the Czochralski crystal growing method. If a wafer substrate that is free of oxygen is desired, the starting material is preferably sliced from a single crystal ingot grown in accordance with any of the conventional variation of the float-zone crystal growing method. Growing a silicon ingot, as well as standard silicon slicing, lapping, etching, and polishing techniques, are well known in the art and disclosed, for example, in F. Shimura, *Semiconductor Silicon Crystal Technology* (Academic Press, 1989); and Silicon Chemical Etching, (J. Grabmaier, ed., Springer-Verlag, New York, 1982).

Figure 1:
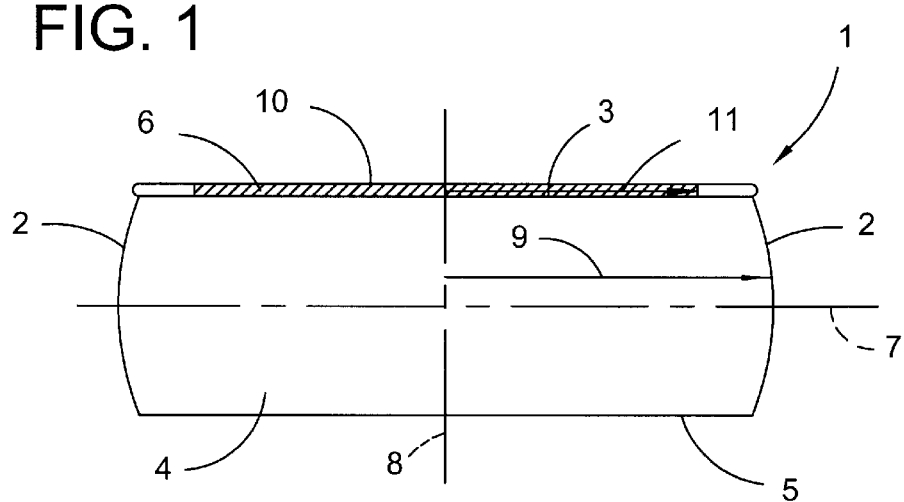
FIG. 1 shows the structure of a single crystal silicon wafer that may be used as the starting material in accordance with the instant invention.

Referring to FIG. 1, the single crystal silicon wafer 1 comprises a wafer substrate 4 which preferably has a central axis 8, a front surface 3, and a back surface 5 which are generally perpendicular to the central axis, an imaginary central plane 7 between the front and back surfaces, a circumferential edge 2 joining the front surface 3 and the back surface 5 and a radius 9 extending from the central axis to the circumferential edge 2. The back surface is free of an oxide seal. It should be noted that because silicon wafers typically have some total thickness variation (TTV), warp, and bow, the midpoint between every point on the front surface and every point on the back surface may not precisely fall within a plane. As a practical matter, however, the total thickness variation, warp, and bow are typically so slight that to a close approximation the midpoints can be said to fall within an imaginary central plane which is approximately equidistant between the front and back surfaces.

The wafer may contain one or more dopants to give the wafer various desired properties. For example, the wafer may be a P-type wafer (i.e., a wafer that has been doped with an element from Group 3 of the Periodic Table such as boron, aluminum, gallium and indium, most typically boron) or an N-type wafer (i.e., a wafer that has been doped with an element from Group 5 of the Periodic Table such as phosphorus, arsenic, antimony, most typically phosphorus). Preferably, the wafer is a P-type wafer having a resistivity of from about 100 Ω-cm to about 0.005 Ω-cm. For boron doped silicon, the foregoing resistivity values correspond to a dopant concentration of about $2 \times 10^{14}$ atoms/cm$^3$ to about $2 \times 10_{19}$ atoms/cm$^3$, respectively. In a particularly preferred embodiment, the wafer is a P-type wafer having a resistivity of about 20 Ω-cm to about 1 Ω-cm (generally referred to as P$^-$-silicon). In another particularly preferred embodiment, the wafer is a P-type wafer having a resistivity of about 0.01 Ω-cm to 0.005 Ω-cm (generally referred to as P$^{++}$-silicon). In another particularly preferred embodiment, the wafer is a P-type wafer having a resistivity of about 0.03 Ω-cm to about 0.01 Ω-cm (generally referred to as P$^+$-silicon).

A wafer prepared using the Czochralski method typically has an oxygen concentration anywhere from about $5 \times 10^{17}$ atoms/cm$^3$ to about $9 \times 10^{17}$ atoms/cm$^3$ (in other words, from about 10 ppm to about 18 ppm (i.e., from about 10 to about 18 oxygen atoms per 1,000,000 total atoms in the wafer)) (ASTM standard F-121-80), and most typically from about $6 \times 10^{17}$ atoms/cm$^3$ to about $8.5 \times 10^{17}$ atoms/cm$^3$ (i.e., from about 12 ppm to about 17 ppm).

B. Epitaxial Silicon Layer

The single crystal silicon wafer prepared in accordance with this invention comprises a surface having an epitaxial silicon layer deposited thereon. The epitaxial layer may be deposited onto the entire wafer, or, alternatively, onto only a portion of the wafer. Referring to FIG. 1, the epitaxial layer 10 is deposited onto the front surface 3 of the wafer and preferably the entire front surface 3 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

Single crystal silicon wafers sliced from ingots prepared by the Czochralski method often have crystal originated pits ("COPs") on their surfaces. A wafer used for integrated circuit fabrication, however, generally is required to have a surface which consists essentially of no COPs. A wafer having an essentially COP-free surface may be prepared by depositing an epitaxial silicon layer onto the surface of the wafer. Such an epitaxial layer fills in the COPs and ultimately produces a smooth wafer surface. This has been the topic of recent scientific investigations. See Schmolke et al., *The Electrochem. Soc. Proc.*, vol. PV98-1, p. 855 (1998); Hirofumi et al., *Jpn. J. Appl. Phys.*, vol. 36, p. 2565 (1997). Typically, COPs on a wafer surface are eliminated by using an epitaxial silicon layer thickness of at least about 0.1 $\mu$m. Preferably, the epitaxial layer has a thickness of at least about 0.1 $\mu$m and less than about 2 $\mu$m. More preferably, the epitaxial layer has a thickness of from about 0.25 $\mu$m to about 1 $\mu$m, and most preferably from about 0.5 $\mu$m to about 1 $\mu$m.

It should be noted that where an epitaxial layer is used for a purpose in addition to eliminating COPs, such a purpose may require an epitaxial layer thickness which is greater than the preferred thickness used to eliminate COPS. For example, if the epitaxial layer is used to impart electrical properties to the wafer surface in addition to eliminating COPs, the thickness of the epitaxial layer may be up to about 200 $\mu$m. Typically, the thickness of an epitaxial layer deposited to impart electrical properties is about 1 $\mu$m to about 100 $\mu$m, and preferably about 2 $\mu$m to about 30 $\mu$m. More preferably, the additional desired effect is achieved with a minimum thickness (e.g., about 3 $\mu$m).

Preferably, the thickness of the epitaxial layer is uniform. The thickness uniformity over the entire surface of a wafer is preferably less than about 1% to about 5% of the target thickness. Thus, if the target thickness is about 3 $\mu$m the thickness variation for the entire wafer surface is preferably less than about 30 nm to about 150 nm. More preferably, the thickness variation for the entire wafer surface is less than about 30 nm to about 100 nm. The thickness of the epitaxial layer is typically measured using Fourier Transform Infra-Red spectrometry (FTIR) at several points over the wafer surface. For example, FTIR may be used to measure the thickness of the epitaxial layer near the center of the wafer and at 4 points near the circumferential edge (e.g., the points being about 90° apart and inward about 5–10 mm of the circumferential edge).

A second method of characterizing the wafer of the present invention is the variation in the surface height of the wafer generally referred to as "nanotopography"—the thickness variation over a localized surface area (e.g., the wafer surface may be divided into imaginary squares measuring 0.5 mm×0.5 mm, 2 mm×2 mm or 10 mm×10 mm). Nanotopography is primarily due to wafer processes such as lapping, etching, and polishing, however the variation in the epitaxial layer thickness is also significant cause. As the critical feature size of photolithography continues to decrease, silicon wafers must meet ever more stringent nanotopography standards (currently, the state of the art critical feature size is about 0.15 $\mu$m to about 0.18 $\mu$m). Variation in the nanotopography of an epitaxial silicon layer is due to thermal gradients in the wafer caused in large part by non-uniform heating of the wafer during the epitaxial deposition process. A significant cause of non-uniform heating can be the relatively large lift pin holes in the susceptor which allow the areas of the wafer directly above the lift pin holes to be heated to a different temperature than the surrounding material. The material from which the lift pins are constructed (e.g., graphite, silicon carbide and quartz) can also result in the areas of the wafer above the lift pins being heated to a different temperature. The temperature difference causes the epitaxial layer to grow at a different rate resulting in localized thickness variations (e.g., 40 nm, 60 nm, or greater) generally known as pinmarks.

In one embodiment of the present invention, the nanotopography for 0.5 mm×0.5 mm areas is preferably less than about 1% of the target thickness of the epitaxial layer, more preferably less than about 0.7% of the target thickness and still more preferably less than about 0.3% of the target thickness. Thus, for a 3 $\mu$m epitaxial layer the nanotopography for 0.5 mm×0.5 mm areas is preferably less than about 30 nm, more preferably less than about 20 nm and still more preferably less than about 10 nm. In a further embodiment of the present invention, the nanotopography for 2 mm×2 mm areas is preferably less than about 1% of the target thickness for the epitaxial layer, more preferably less than about 0.7% of the target thickness and still more preferably less than about 0.3% of the target thickness. In an additional embodiment, the nanotopography for 10 mm×10 mm areas is preferably less than about 3% of the target thickness of the epitaxial layer.

C. Epitaxial Growth Process

As discussed above, a single side polished wafer with etched backsides and a double side polished wafer have a native oxide layer on the front and back surfaces. In accordance with the present invention, the epitaxial deposition process incorporates the removal of the native oxide layer from the front surface and substantially the entire back surface of the wafer prior to depositing the epitaxial layer on the front surface. The removal of the silicon oxide layer is preferably accomplished by heating the surface of the wafer in an atmosphere consisting essentially of no oxidants (most preferably, the atmosphere is oxidant-free) until the silicon oxide layer is removed from the surface. In a particularly preferred embodiment, the surface of the wafer is heated to a temperature of at least about 1100° C., and more preferably to a temperature of at least about 1150° C. This heating preferably is conducted while exposing the entire front surface and substantially the entire back surface of the wafer to a cleaning gas comprising a noble gas (e.g., He, Ne, or Ar), $H_2$, HF gas, HCl gas, or a combination thereof. More preferably, the cleaning gas comprises $H_2$, or a combination of $H_2$ and HCl. Most preferably, the cleaning gas consists essentially of $H_2$. It should be noted that although atmospheres containing $N_2$ may be used, such atmospheres are less preferred because they tend to form nitrides on the surface which may interfere with subsequent epitaxial deposition on the surface. The flow rate of the cleaning gas is typically between about 1 liter/minute and about 50 liters/minute, and preferably between about 10 liters/minute and about 20 liters/minute, for at least about 10 seconds.

Exposing the back surface of the wafer to the cleaning gas to remove the native oxide layer substantially reduces, or eliminates, the halo effect that results from pinholes in the native oxide layer. Stated another way, removing the native oxide prior to growing the epitaxial silicon layer results in a wafer back surface on which the halo is not visible to the human eye under a wafer inspection bright light or a laser surface scanner.

Prior to or during the removal of the native oxide layer, the wafer preferably is heated at a rate which does not cause slip. More specifically, if the wafer is heated too quickly, a thermal gradient will develop which will create an internal stress sufficient to cause different planes within the wafer to shift relative to each other (i.e., slip). Below about 750° C. to about 800° C., rapid heating of the wafer is not a significant cause of slip, however, between about 800–900° C. to about 1150–1200° C. rapidly heating the wafer can cause slip. Lightly doped wafers (e.g., a wafer doped with boron and having a resistivity of about 1 Ω-cm to about 100 Ω-cm) have been found to be particularly susceptible to slip. To avoid this problem, the wafer preferably is heated from about 800–900° C. to the silicon oxide removal temperature at an average rate of about 20° C./sec to about 35° C./sec.

Following the removal of native oxide layer from the front and back surfaces of the wafer, the flow of cleaning gas is discontinued and the temperature in the reaction chamber is adjusted to between about 600° C. and about 1200° C., preferably at least about 1100° C. and more preferably at least about 1150° C. The front surface of the wafer is then contacted with a silicon containing source gas to deposit the epitaxial layer onto the front surface. Preferably, the surface is contacted with the source gas less than 30 seconds after the native oxide is removed, more preferably within about 20 seconds after the native oxide layer is removed, and most preferably within about 10 seconds after the native oxide layer is removed. Waiting to initiate silicon deposition for about 10 seconds after removal of the silicon oxide layer allows the temperature of the wafer to stabilize and become uniform.

The epitaxial deposition preferably is carried out by chemical vapor deposition. Generally speaking, chemical vapor deposition involves exposing the surface of the wafer to an atmosphere comprising silicon in an epitaxial deposition reactor, e.g., an EPI CENTURA® reactor (Applied Materials, Santa Clara, Calif.). In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (most preferably $H_2$). In one embodiment, the source of silicon during the epitaxial deposition is $SiH_2Cl_2$ or $SiH_4$. If $SiH_2Cl_2$ is used, the reactor pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air leaking into the reactor chamber is lessened.

During the epitaxial deposition, the temperature of the wafer surface preferably is maintained at a temperature sufficient to prevent the atmosphere comprising silicon from depositing polycrystalline silicon onto the surface. Generally, the temperature of the surface during this period preferably is at least about 900° C. More preferably, the temperature of the surface is maintained at from about 1050 to about 1150° C. Most preferably, the temperature of the surface is maintained at the silicon oxide removal temperature.

The rate of growth of the epitaxial layer is preferably about 3.5 μm/min to about 4.0 μm/min when the deposition is conducted under atmospheric pressure. This may be achieved, for example, by using an atmosphere consisting essentially of about 2.5 mole % $SiHCl_3$ and about 97.5 mole % $H_2$ at a temperature of about 1050° C. to 1150° C. at a flow rate of about 1 liter/minute to about 20 liters/minute.

If the intended use of the wafer requires that the epitaxial layer include a dopant, the atmosphere comprising silicon also preferably contains the dopant. For example, it is often preferable for the epitaxial layer to contain boron. Such a layer may be prepared by, for example, including $B_2H_6$ in the atmosphere during the deposition. The mole fraction of $B_2H_6$ in the atmosphere needed to obtain the desired properties (e.g., resistivity) will depend on several factors, such as the amount of boron out-diffusion from the particular substrate during the epitaxial deposition, the quantity of P-type dopants and N-type dopants that are present in the reactor and substrate as contaminants, and the reactor pressure and temperature. Similar to the wafer substrate, the concentration of dopant in the epitaxial layer may be controlled to yield a wide range of resistivities. For example, an atmosphere containing about 0.03 ppm of $B_2H_6$ (i.e., about 0.03 mole of $B_2H_6$ per 1,000,000 moles of total gas) at a temperature of about 1125° C. and a pressure of about 1 atm. has been used to obtain an epitaxial layer having a resistivity of about 10 Ω-cm.

At the same time the front surface of the silicon wafer is contacted with a silicon containing source gas, a purge gas is introduced into the chemical vapor deposition chamber to reduce the number of out-diffused dopant atoms from the back surface of the wafer that are incorporated into the epitaxial layer growing on the front surface of the wafer. The purge gas may comprise nitrogen, argon, hydrogen, a gas comprising silicon such as trichlorosilane, or mixtures thereof. For example, when using an Epsilon® epitaxial reactor manufactured by ASM, the purge gas is preferably the same composition as the epitaxial deposition gas (e.g., a mixture of trichlorosilane and hydrogen). Typically, the flow rate of the purge gas is between about 1 liter/minute and about 50 liters/minute and preferably between about 10 liters/minute and about 20 liters/minute.

Substantially the entire back surface of the wafer is exposed to the purge gas and the out-diffused atoms from the back surface are directed away from front surface thereby reducing, or eliminating, their incorporation in the epitaxial layer being deposited at the annular region near the circumferential edge of the substrate. Thus, the resistivity of the epitaxial layer remains substantially unaffected by autodoping, i.e., the decrease in resistivity due to autodoping is less than about 10%, preferably less than about 5% and more preferably less than about 2%. Referring to FIG. 1, the region of the epitaxial layer 10 that is substantially unaffected by autodoping can be characterized as an axially symmetric region 6 extending radially outward from the central axis 8 toward the circumferential edge 2 having a radius 11 of at least about 80% of the length of the radius of the substrate 9. Preferably, the radius of the axially symmetric region 11 is at least about 85%, 90%, 95% or 100% of the length of the radius of the substrate 9.

Once an epitaxial layer having the desired thickness has been formed, the atmosphere comprising silicon preferably is purged from the reaction chamber with a noble gas, $H_2$, or a combination thereof, and more preferably with $H_2$ alone. Afterward, the wafer preferably is cooled to a temperature at which it can be handled without imparting damage (typically no greater than about 800–900° C., however, some apparatus can handle wafers at temperatures substantially higher than about 900° C.) and is then removed from the epitaxial deposition reactor.

D. Epitaxial Deposition Reactor

As discussed above, the wafer of the present invention is produced by an epitaxial deposition process that integrates several distinct steps: (a) removing the native oxide layer from both the front and back surfaces of the wafer; (b) growing the epitaxial silicon layer on the front surface of the wafer by exposing the front surface of the wafer to a silicon containing source gas; and (c) exposing the back surface of the wafer to a purge gas. To accomplish the foregoing in a single epitaxial deposition process, the epitaxial deposition reactor of the present invention is modified to allow the fluid flow of process gases to the front and back surface of the wafer.

Typically, an epitaxial deposition reactor comprises a chamber usually constructed of quartz, a gas inlet for allowing process gases to enter the reactor, a gas outlet for removing process gases from the reactor, a heating element for heating the silicon wafer, a susceptor for supporting the wafer and rotatable means for supporting the susceptor and wafer. In the present invention, the susceptor is replaced with a wafer support device that permits fluid contact with the front surface of the wafer and substantially the entire back surface of the wafer. Advantageously, permitting fluid contact with the front and back surface of the wafer substantially eliminates "floating" during loading. Additionally, the wafer support device allows the cleaning gas utilized in the pre-bake step of an epitaxial deposition process to contact substantially the entire back surface of the silicon wafer and chemically remove substantially the entire native oxide layer such that during the growth of the epitaxial layer when source gas contacts the back surface of the silicon wafer a smooth continuous layer of silicon is grown and the halo affect on the back surface is significantly reduced or eliminated. Furthermore, the wafer support device allows dopant atoms contained in the silicon wafer that out-diffuse from the back surface of the wafer during the epitaxial deposition process to be carried away from the front surface of the wafer in a purge gas stream and out the exhaust. Exhausting out-diffused dopant atoms prevents a substantial amount of dopant from effusing between the wafer and the susceptor edge and contacting the front surface resulting in unwanted autodoping of the front surface.

The wafer support device may be configured in any manner that allows process gases, in particular the cleaning gas and the purge gas, to contact the back surface of the silicon wafer substrate. The wafer support device may be sized to accommodate any diameter silicon wafer including, for example, 150 mm, 200 mm and 300 mm wafers and larger. The wafer support device may be constructed of conventional materials such as high purity graphite with a silicon carbide or glassy carbon layer covering the graphite to reduce the amount of contaminants released into the surrounding ambient from the graphite during the high temperature epitaxial deposition process. The graphite utilized to construct the wafer support device is generally at least about 99%, more preferably at least about 99.9% and most preferably at least about 99.99% pure graphite. Also, the graphite preferably contains less than about 20 ppm total metals particularly iron, molybdenum, copper, and nickel, and more preferably less that about 5 ppm total metals particularly iron, molybdenum, copper, and nickel. The silicon carbide or glassy carbon coating covering the graphite generally has a thickness of about 75 $\mu$m to about 150 $\mu$m, preferably about 100 $\mu$m to about 125 $\mu$m. Similar to the graphite, the silicon carbide or glassy carbon coating should have a total metal concentration less than about 20 ppm and preferably less than about 5 ppm.

The epitaxial deposition reactor of the present invention may also comprise optional devices to improve the quality of the wafer or enhance throughput. For example, an edge ring may be located outward of the periphery of the silicon wafer and/or wafer support device to enhance temperature uniformity across the wafer by insulating the edge of the wafer and/or preheating process gases flowing into the chamber before they contact the wafer surface. Additionally, the reactor may comprise chamber dividers which enhance the separation of the silicon containing source gas flow and the purge gas flow thereby increasing the efficiency of the deposition process. Similar to a susceptor, the edge ring and chamber dividers are typically constructed of graphite coated with silicon carbide or glassy carbon.

E. Perforated Susceptor

1. Perforated Susceptor in Which the Wafer Rests on an Inner Annular Ledge

Figure 2:
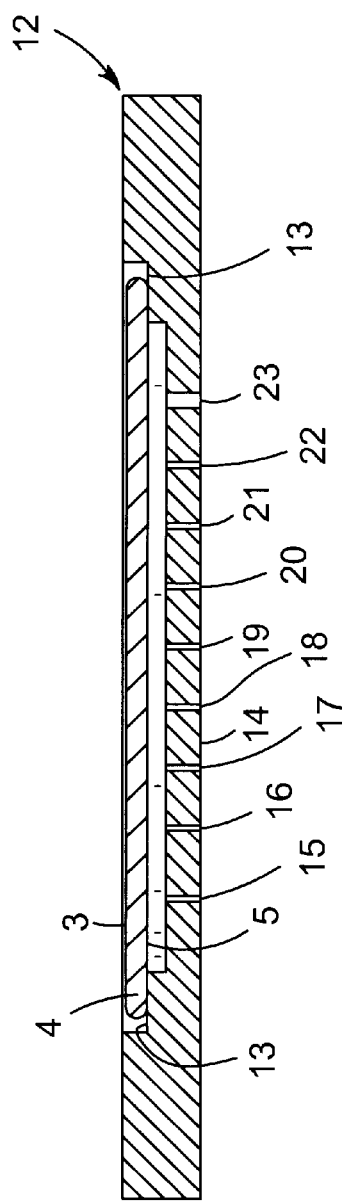
FIG. 2 is a cross section of an embodiment of the wafer support device of the present invention taken in the plane of line 26—26 of FIG. 3.

In a particular configuration, or embodiment, the wafer support device is a perforated susceptor. Referring now to FIG. 2 there is shown a cross sectional view of a perforated susceptor 12. The perforated susceptor 12 that has an inner annular ledge 13 which is capable of supporting a silicon wafer substrate 4 which has a front surface 3 and a back surface 5. The perforated susceptor 12 has a porous surface 14 with a plurality of holes or openings 15, 16, 17, 18, 19, 20, 21 and 22. Perforated susceptors for use in single wafer reactors with backside robotic handling (e.g, a Centura® reactor manufactured by Applied Materials) also require wafer lift pin holes 23, 24 and 25 (not shown, see FIG. 3). In contrast, a perforated susceptor for use in the single wafer Epsilon® reactor manufactured by ASM or in manually loaded barrel reactors do not require lift pin holes. The terms openings and holes may be used interchangeably herein and both refer to the open passageways in the porous surface 14. Porous surface 14 having the openings is located directly below the silicon wafer substrate 4. As used herein, the term "plurality" means two or more holes. Holes 15, 16, 17, 18, 19, 20, 21 and 22 are drilled into perforated susceptor 12 prior to the coating being applied. During the pre-bake step of an epitaxial deposition process, holes 15, 16, 17, 18, 19, 20, 21 and 22 allow the cleaning gas to contact substantially the entire back surface 5 of silicon wafer substrate 4 to allow the cleaning gas to react with, and remove substantially all native oxide on the back surface 5 of silicon wafer substrate 4. The portion of back surface 5 of silicon wafer substrate 4 in contact with the inner annular ledge 13 of susceptor 12 is also substantially etched by the cleaning gas as the gas will effuse between the wafer and the susceptor resulting in substantially complete removal of the native oxide layer on the back surface. The removal of the native oxide from the back surface 5 significantly reduces or eliminates any halo effect on the back surface of the silicon wafer as any source gas that effuses between the wafer and the susceptor during the epitaxial growth process and contacts back surface 5 will grow smoothly and continuously on the silicon surface. Holes 15, 16, 17, 18, 19, 20, 21 and 22 also allow dopant atoms that out-diffuse from the back surface 5 of silicon wafer substrate 4 during the high temperature cleaning step and the epitaxial deposition step of an epitaxial deposition process to drain through the holes into a purge gas or hydrogen stream and away from the front surface 3 of silicon wafer substrate 4 into the exhaust system. As such, a significant reduction in autodoping of the front surface during an epitaxial deposition process is realized.

Referring now to FIG. 3, there is shown a top view of perforated susceptor 12 having inner annular ledge 13 and porous surface 14 having a plurality of holes. A perforated susceptor for use in a reactor with backside wafer handling also requires wafer lift pin holes 23, 24, and 25 on porous surface 14 to allow lift pins (not shown) below the perforated susceptor 12 to raise and lower silicon wafers onto and off of the perforated susceptor 12 during and after an epitaxial deposition process. Edge ring 27 (see FIG. 4) surrounds the periphery of the perforated susceptor 12 to ensure temperature uniformity across a silicon wafer. Edge ring 27 generally has a diameter that is about 4 cm to about 10 cm greater than the diameter of the perforated susceptor 12.

The holes in the porous surface of the perforated susceptor located directly below the silicon wafer preferably have a diameter such that the silicon carbide or glassy carbon coating, if applied to the susceptor after the holes have been drilled into the susceptor, will not substantially block or plug the holes and thus restrict fluid flow therethrough. It will be recognized by one skilled in the art that the openings, generally referred to as holes throughout, could be squares, slots, diamond shapes, or any other shapes allowing fluid flow therethrough. The openings preferably have a width of between about 0.1 mm and about 3 mm, more preferably between about 0.1 mm and about 1 mm, and most preferably between about 0.5 mm and about 1 mm. The width of the openings is defined as the smallest distance between two corners of the opening or the diameter if the opening is a circle. The holes are spaced on the perforated susceptor to allow the cleaning gas utilized during the pre-bake step of the epitaxial deposition process to contact and etch substantially the entire back surface of the silicon wafer. Spacing the holes of the perforated susceptor of between about 0.5 mm and about 4 cm apart, more preferably between about 2 mm and about 2 cm apart, and most preferably between about 6 mm and about 1.5 cm apart allows the cleaning gas to contact substantially the entire back surface of the silicon wafer such that it may etch substantially all of the native oxide from the back surface. The total percentage of open area on the perforated surface of the susceptor is between about 0.5% and about 4% of the total surface area of the perforate surface, more preferably between about 1% and about 3% of the total surface area of the perforated surface. The perforated surface of the susceptor preferably has a density of between about 0.2 holes/cm$^2$ and about 4 holes/cm$^2$, more preferably between about 0.8 holes/cm$^2$ and about 1.75 holes/cm$^2$. Density as used herein means either a uniform or non-uniform density.

It is generally preferred that the holes in the perforated susceptor have as small a diameter as practical yet not allow the silicon carbide or glassy carbon coating to restrict fluid flow through the holes to the back surface of the silicon wafer. If the holes in the susceptor are drilled too large, nanotopography problems on the front surface of the wafer that are caused by localized temperature non-uniformity on the back surface can occur. Large diameter holes in the perforated susceptor can lead to the development of hot spots or cold spots on the back surface of the silicon wafer through direct irradiation of the back surface by the heating lamps located below the silicon wafer. These hot or cold spots cause temperature gradients to form across the front surface of the silicon wafer and can lead to non-uniform epitaxial silicon growth on the front surface of the silicon wafer. Non-uniform growth of the epitaxial layer significantly degrades the wafer quality. The holes on the perforated susceptor can be drilled into the susceptor at an oblique angle to further reduce the possibility of direct irradiation of the back surface by the heating lamps and the formation of hot or cold spots leading to non-uniform epitaxial growth on the front surface yet still allow gases to penetrate the susceptor and contact the back surface and allow out-diffused dopant atoms to move away from the back surface. To further decrease the potential for the formation of hot or cold spots and the creation of temperature gradients on the silicon wafer by direct illumination of the wafer through the holes and reduce or eliminate any hot or cold spots caused by the lift pin holes, the lamp power ratio of the heating lamps above and below the silicon wafer can be adjusted and tuned to produce a balanced heating from the lamps.

Figure 4:
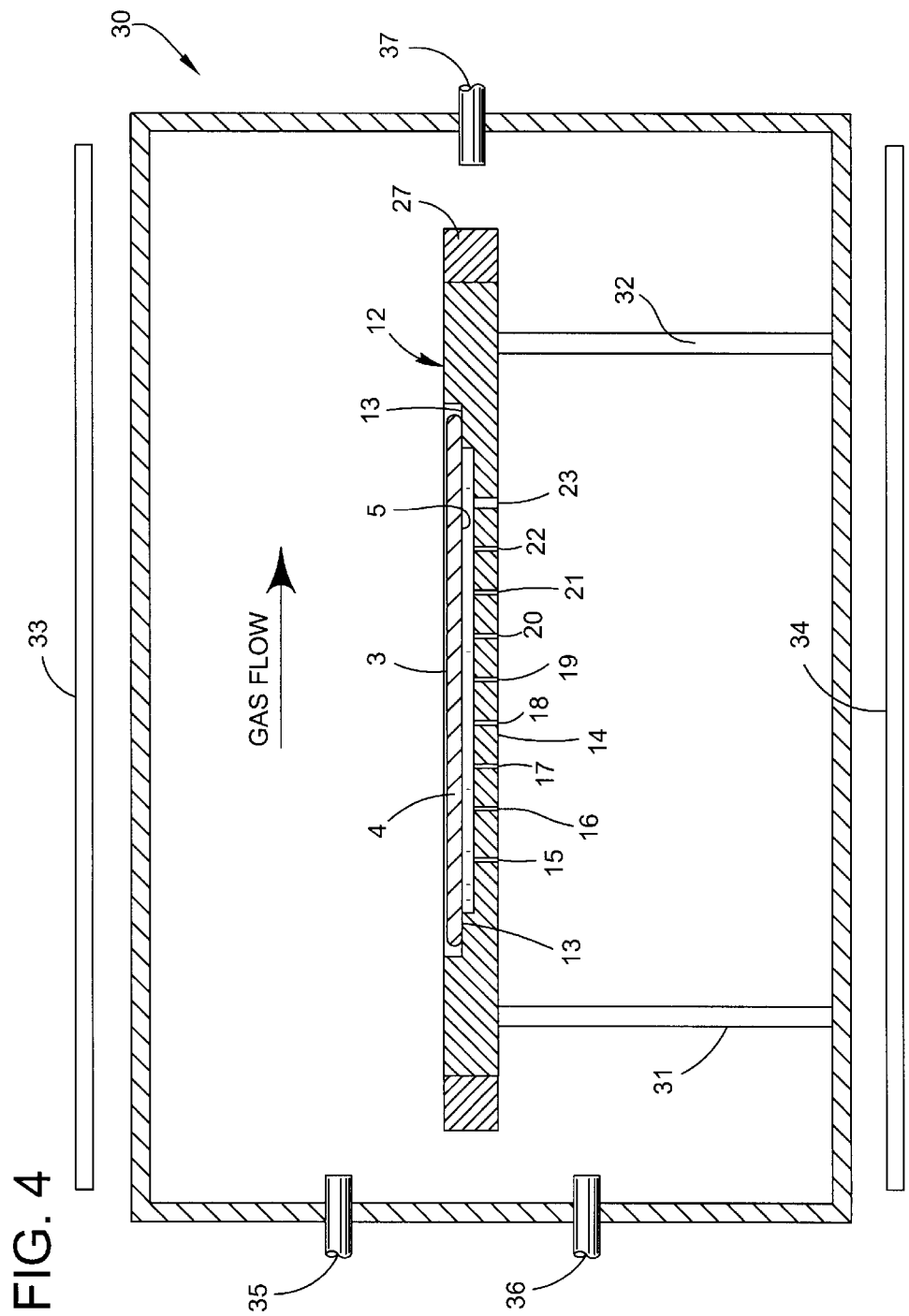
FIG. 4 is an epitaxial reaction chamber showing a embodiment of the wafer support device of the present invention in cross section taken in the plane of line 26—26 of FIG. 3.

Referring now to FIG. 4, there is shown an epitaxial reaction chamber 30 for use during an epitaxial growth process utilizing the perforated susceptor 12 of the present invention. Perforated susceptor 12 is attached to rotatable supports 31 and 32 and is sized and configured to support silicon wafer substrate 4 on inner annular ledge 13 during an epitaxial deposition process. Silicon wafer substrate 4 is in a spaced relationship with holes 15, 16, 17, 18, 19, 20, 21 and 22 in porous surface 14 in perforated susceptor 12. Lift pin hole 23 allows a lift pin (not shown) access through porous surface 14 of perforated susceptor 12 to silicon wafer substrate 4 such that silicon wafer substrate 4 may be lifted onto and off of perforated susceptor 12 before and after an epitaxial deposition process. Epitaxial deposition chamber 30 also contains heating lamp arrays 33 and 34 located above and below perforated susceptor 12 respectively for heating during an epitaxial deposition process. Gas inlets 35 and 36 allow the introduction of the cleaning gas during the prebake step of the epitaxial deposition process such that cleaning gas is introduced above and below the silicon wafer substrate 4 to enhance the native oxide removal of the front surface 3 and back surface 5 of silicon wafer substrate 4. During the epitaxial growth step, gas inlet 35 introduces a silicon containing source gas which is flowed above the silicon wafer substrate 4 and gas inlet 36 introduces hydrogen or an inert gas below the silicon wafer substrate 4 to flush the back surface 5 of the silicon wafer substrate 4 and carry out-diffused dopant atoms away from the front surface. As indicated in FIG. 4, the gas injected into the epitaxial deposition chamber preferably flows parallel to the front and back surfaces of the silicon wafer (a parallel flow pattern, however is not required). Such a flow pattern allows the injected gases to contact the front surface and penetrate the susceptor through the holes in the susceptor's surface to contact the back surface of the wafer. Because the gases flow parallel to the silicon surfaces and not perpendicular, the possibility of the silicon wafer being lifted off of the annular ledge by gasses effusing between the wafer edge and edge of the annular ledge and becoming deformed is significantly reduced or eliminated. Gases introduced into chamber 30 from gas inlets 35 and 36 are removed from chamber 30 through exhaust port 37.

The holes in the perforated susceptor allow the cleaning gas to pass through the perforated susceptor and contact substantially the entire back surface of the silicon wafer during the cleaning step such that any native oxide present on the back surface will be removed by the cleaning gas. This native oxide removal from the back surface will allow a smooth, continuous epitaxial silicon layer to grow on any portion of the back surface of the silicon wafer that is contacted with the source gas during the growth of the epitaxial layer and thus will substantially eliminate the formation of any halo on the back surface. Furthermore, the holes in the perforated susceptor will allow inert gas or hydrogen to contact the back surface of the wafer such that dopant atoms that out-diffuse from the back surface during both the cleaning step and the epitaxial growth step may be carried away from the silicon wafer and into the exhaust thus substantially decreasing the possibility of autodoping the front surface of the wafer.

2. Perforated Susceptor in Which the Wafer Rests on the Porous Surface

Figure 5:
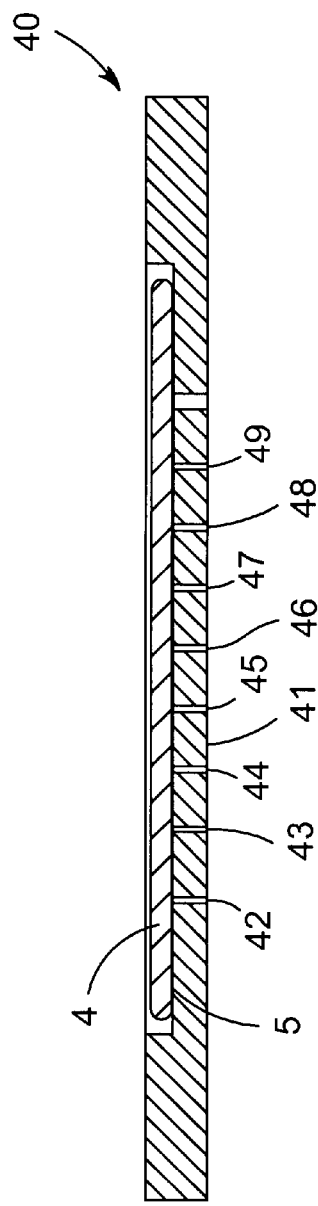
FIG. 5 is a cross section of an embodiment of the wafer support device of the present invention.

In an alternative embodiment of the present invention, the perforated susceptor may be sized and configured to allow the silicon wafer to rest directly on the porous surface thus eliminating the inner annular ledge 13 as shown in FIG. 4. Referring now to FIG. 5, there is shown a cross section of a perforated susceptor where the silicon wafer rests directly upon the porous surface. The back surface 5 of silicon wafer substrate 4 sits directly on porous surface 41 of perforated susceptor 40. Although back surface 5 of wafer substrate 4 is in direct contact with the porous surface 41, gases flowed beneath perforated susceptor 40 are able to penetrate porous surface 41 through holes 42, 43, 44, 45, 46, 47, 48 and 49 and contact substantially the entire back surface 5 of wafer substrate 4.

Figure 6:
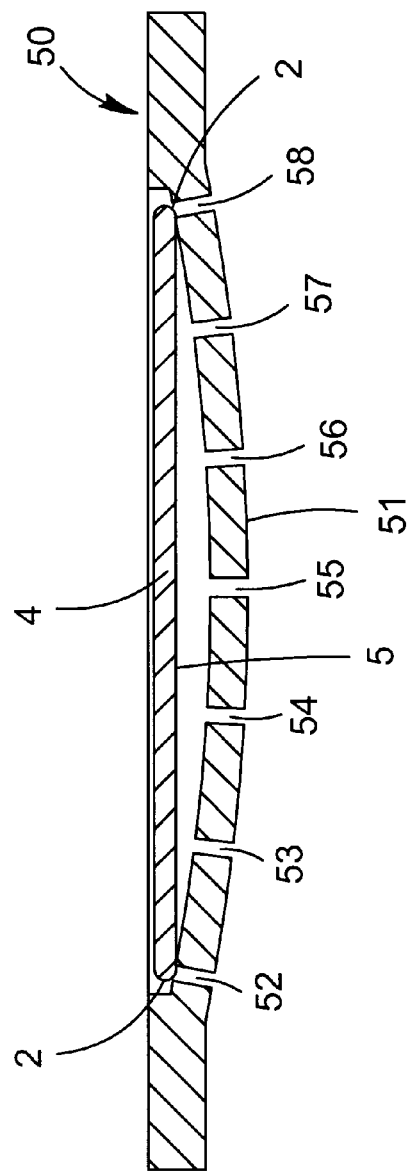
FIG. 6 is a cross section of an embodiment of the wafer support device of the present invention.

3. Perforated Susceptor in Which the Wafer Rests on a Concave Porous Surface In a further alternative embodiment, the perforated susceptor of the present invention as illustrated in FIG. 5 may be further modified such that porous surface is shaped in a dish shape to allow only the outer edges of the silicon wafer to contact the perforated susceptor. Referring now to FIG. 6, there is shown a cross section of a perforated susceptor 50 where the silicon wafer rests directly on the porous surface 51 of the susceptor 50. The back surface 5 of silicon wafer substrate 4 sits directly on porous surface 51 of perforated susceptor 50. Porous surface 51 is shaped like a dish such that the outer edges 2 of silicon wafer substrate 4 are in direct contact with the porous surface 51 and the remainder of back surface 5 of wafer substrate 4 is not in direct contact with porous surface 51. During use, holes 52, 53, 54, 55, 56, 57 and 58 allow fluid flow therethrough to the back surface of the wafer.

It will be recognized by one skilled in the art that the perforated susceptor of the present invention can be utilized with various types of deposition reactors including barrel, pancake and mini batch reactors regardless of the shape of the susceptor utilized.

F. Susceptor With Extended Lift Pins

Figure 7:
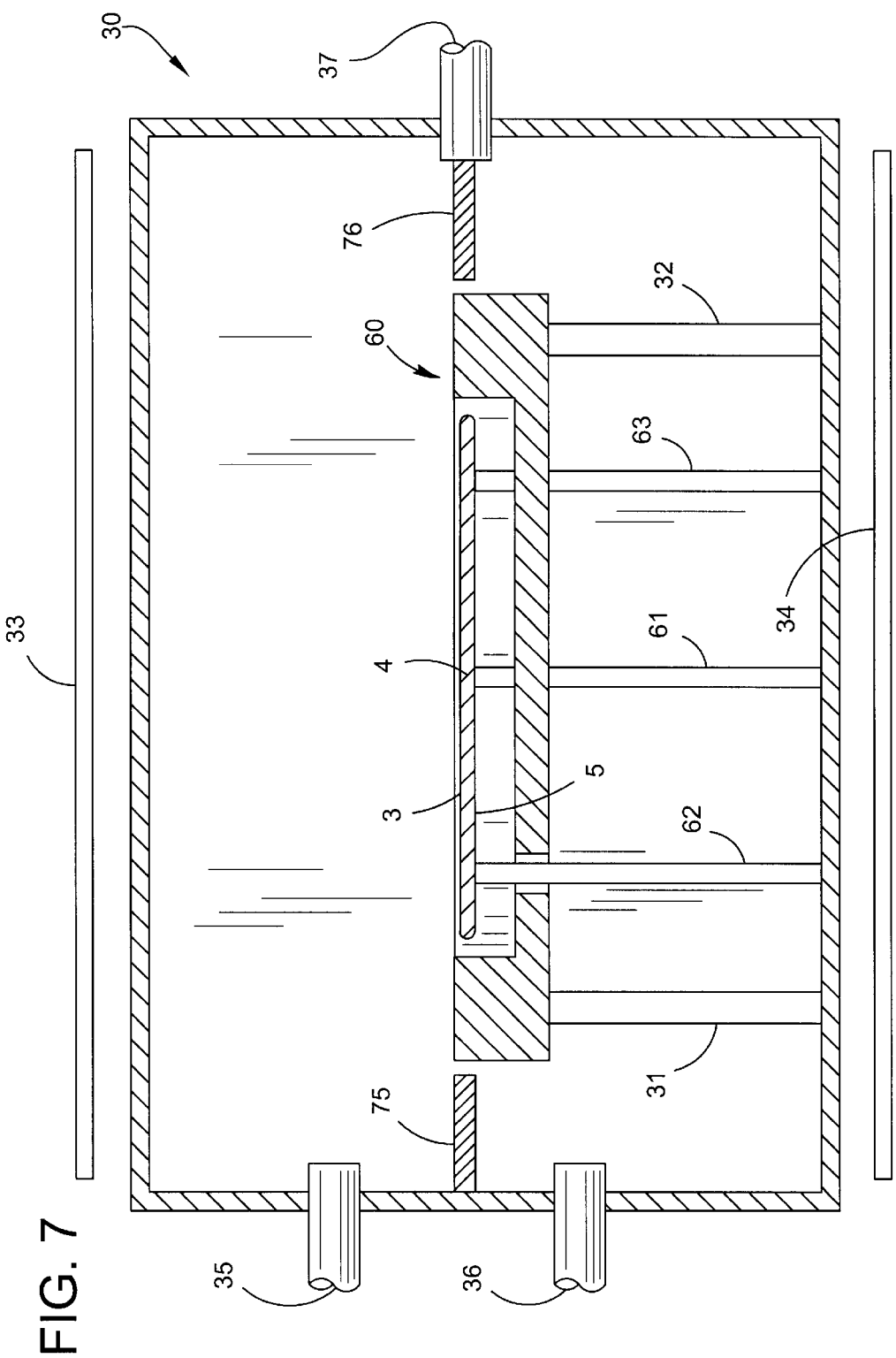
FIG. 7 is an epitaxial reaction chamber of the present invention showing an embodiment of the wafer support device.

Referring now to FIG. 7, in an alternative embodiment of the present invention, the wafer support device may be a conventional susceptor 60 in which at least three lift pins 61–63 remain in the extended, or up, position throughout the entire epitaxial deposition process (i.e., during the pre-bake and epitaxial growth). Elevating the silicon wafer above the susceptor 60 allows the cleaning gas introduced into the epitaxial deposition chamber 30 during the pre-bake to contact and remove the native oxide layer from the back surface 5 of the wafer substrate 4 and prevent the formation of a chemical vapor deposition induced halo. Similarly, purge gas introduced into the epitaxial deposition chamber 30 during the growth of the epitaxial silicon layer is able to direct dopant atoms released from the back surface 5 away from the front surface 3 and prevent autodoping of the epitaxial silicon layer.

G. Open Wafer Support Devices

In an alternative embodiment of the present invention, the wafer is supported in a manner which exposes substantially the entire back surface of the wafer to radiation directly from the heater elements (i.e., an open wafer support device). The use of open wafer support devices in epitaxial deposition chambers may be preferable depending on the particular application. For example, an open wafer support may allow the wafer to reach the desired deposition temperature more quickly and thereby increase throughput. Further, an open wafer support may allow a wafer to be heated more uniformly than on a perforated susceptor which allows for a more uniform epitaxial layer (i.e., decreased nanotopography).

1. Pin Support

Figure 8:
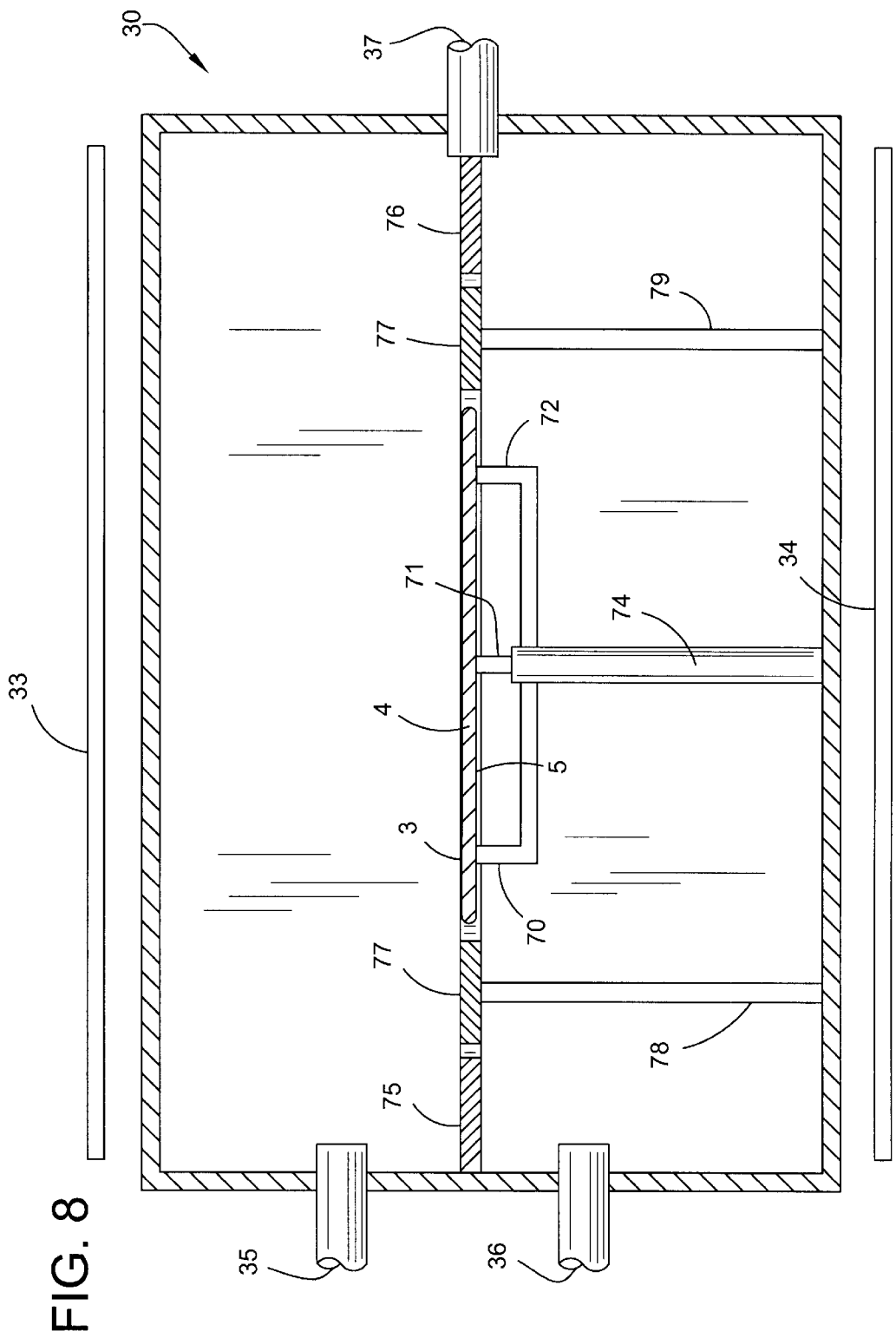
FIG. 8 is an epitaxial reaction chamber of the present invention showing an embodiment of the wafer support device.

One embodiment of an open wafer support device comprises at least three pins extending from a rotatable support, the pins contacting the back surface of the wafer inward from the circumferential edge of the wafer to support the wafer during the epitaxial growth process similar to the device used in a Steag® SHS3000 rapid thermal annealer. Referring now to FIG. 8, there is shown an epitaxial reaction chamber 30 for use during an epitaxial growth process utilizing the pin support of the present invention. Three pins 70, 71 and 72 are attached to rotatable support 74 and are sized and configured to support silicon wafer substrate 4 during an epitaxial deposition process. Epitaxial deposition chamber 30 also contains heating lamp arrays 33 and 34 located above and below the wafer substrate 4 respectively for heating during an epitaxial deposition process. Gas inlets 35 and 36 allow the introduction of the cleaning gas during the pre-bake step of the epitaxial deposition process such that cleaning gas is introduced above and below the silicon wafer substrate 4 to enhance the native oxide removal of the front surface 3 and back surface 5 of silicon wafer substrate 4. During the epitaxial growth step, gas inlet 35 introduces a silicon containing source gas which is flowed above the wafer substrate 4 and gas inlet 36 introduces hydrogen or an inert has below the wafer substrate 4 to flush the back surface 5 of the silicon wafer substrate 4 and carry out-diffused dopant atoms away from the front surface 3. The epitaxial deposition chamber 30 comprises an edge ring 77 on supports 78 and 79 to enhance temperature uniformity across the wafer surface.

2. Ring Support

Figure 9:
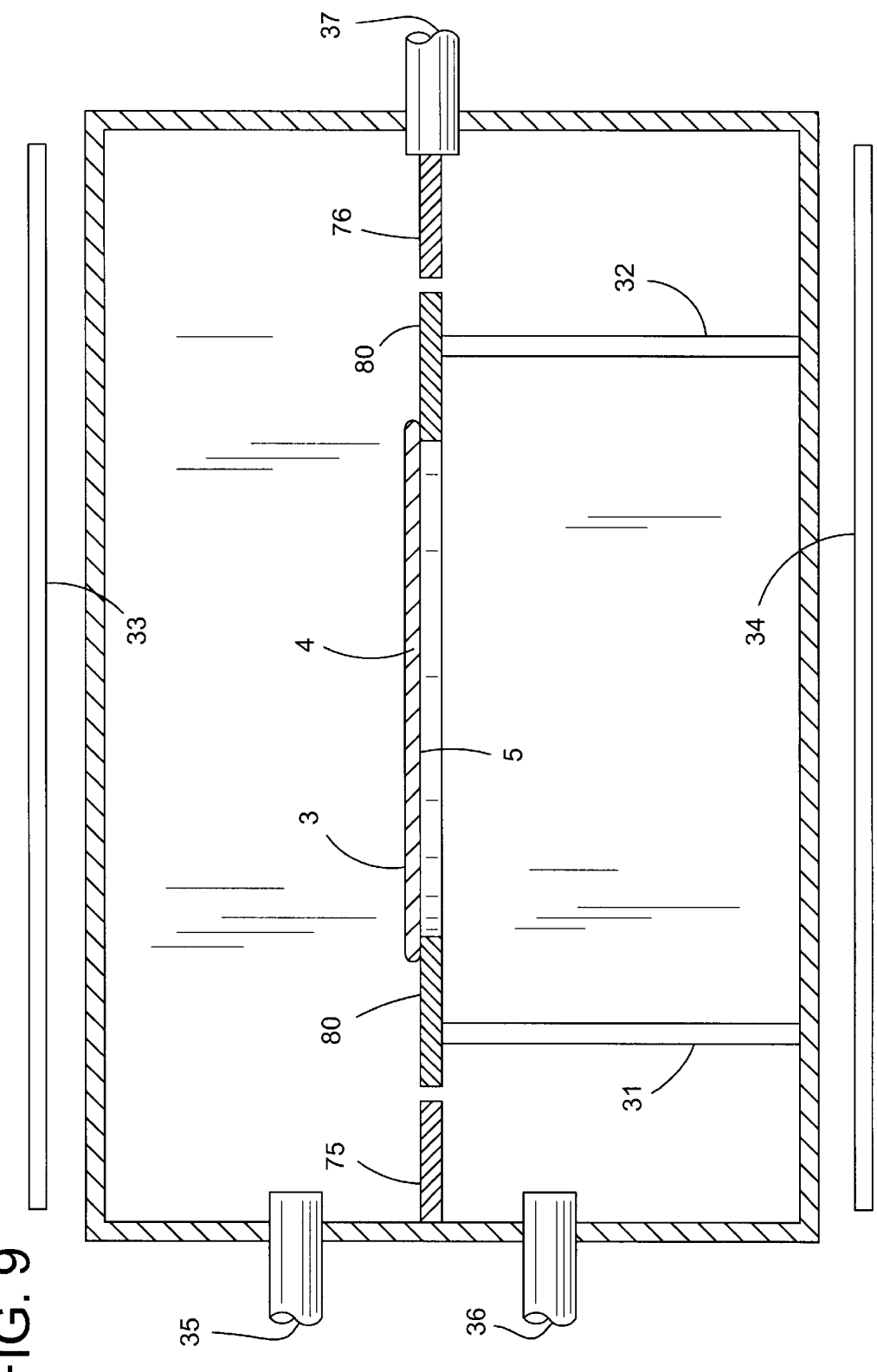
FIG. 9 is an epitaxial reaction chamber of the present invention showing an embodiment of the wafer support device.
Figure 10:
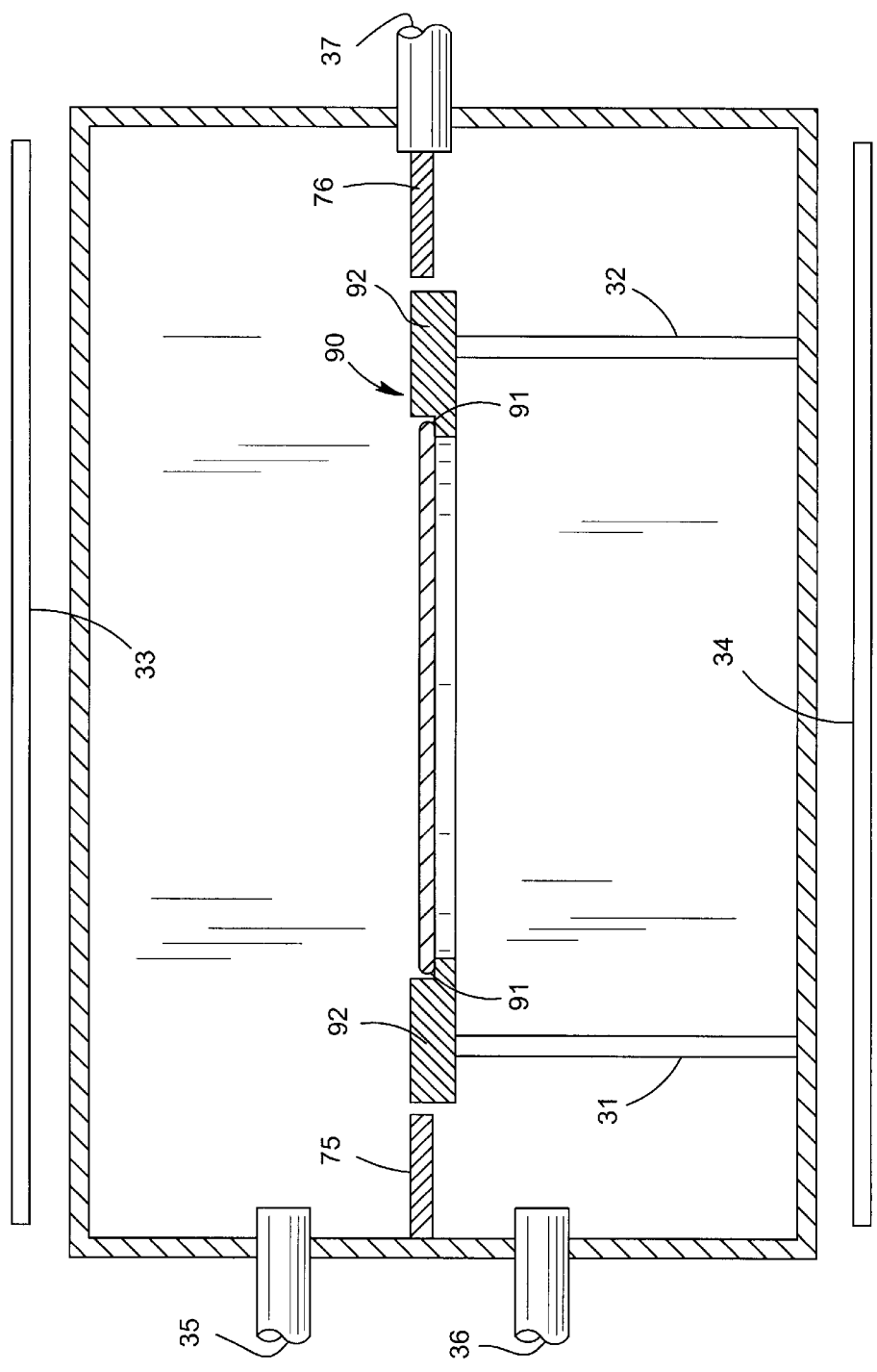
FIG. 10 is an epitaxial reaction chamber of the present invention showing an embodiment of the wafer support device.

Referring now to FIG. 9, in an alternative embodiment, the wafer support device is a ring support 80 similar to that used in a Centura® rapid thermal processor manufactured by Applied Materials. Referring now to FIG. 10, the ring support 90 preferably comprises an inner annular ledge 91 to support the wafer substrate 4 and an outer annular step 92 which acts much like an edge ring to insulate the circumferential edge of the wafer and preheat reaction gases to prevent slip.

H. Efficacy of the Epitaxial Deposition Process of the Present Invention

Figure 11:
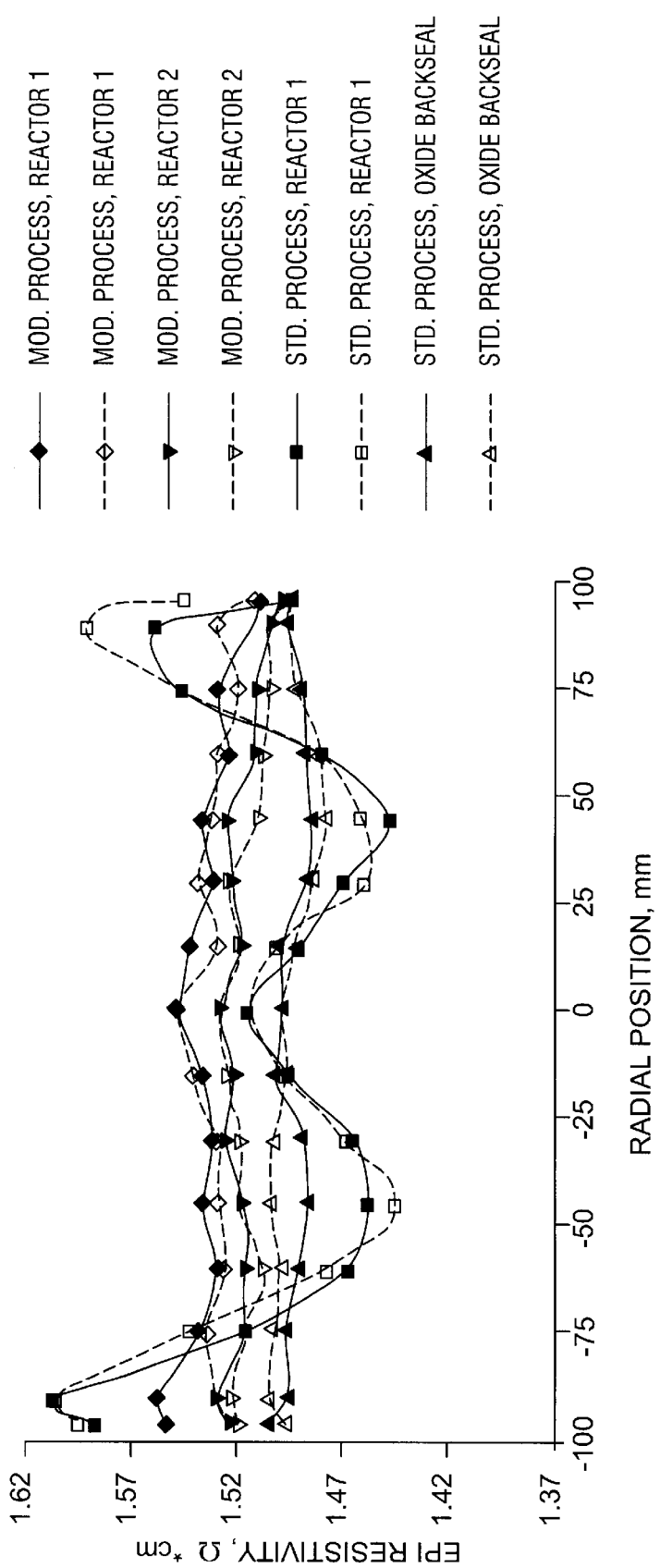
FIG. 11 is a graph comparing the resistivity profile of epitaxial layers deposited on silicon wafers grown in accordance with the present invention and conventional practices.

Several experiments have been performed to evaluate the efficacy of the method and apparatus of the present invention to produce the single crystal wafer of the present invention. For example, epitaxial layers about 2.75 μm thick were deposited on 200 mm diameter boron-doped wafer substrates having a resistivity of about 0.005 Ω-cm to about 0.01 Ω-cm using a typical susceptor and a perforated susceptor. Referring now to FIG. 11, it can be seen that the wafers which had a back surface oxide seal had a substantially uniform resistivity across the wafer surface. Likewise, epitaxial layers deposited using the perforated susceptor on wafers without a back surface oxide seal had a substantially uniform resistivity across the wafer surface. However, epitaxial layers deposited on wafers without a back surface oxide seal using a standard susceptor had a nonuniform resistivity across the wafer surface—the "W" shape of the resistivity plot as a function of surface position is due in large part to the manipulation of process variables such as temperature and gas flow to compensate for the autodoping near the circumferential edge in order to keep the resistivity within acceptable limits. Without such manipulation, the resistivity would be substantially uniform from the center to approximately 10 mm from the circumferential edge and the resistivity would decrease substantially in the last 10 mm do to autodoping. For example, the resistivity of the epitaxial layer in the 10 mm inward of the circumferential edge can decrease about 10 to about 20 percent, or about 50 percent or more depending on the difference between the resistivity of the substrate and the epitaxial layer.

Figure 12A:
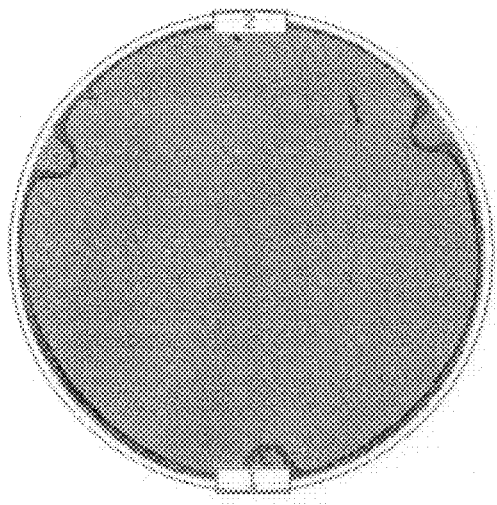
FIG. 12A is a map of a wafer without a back surface seal after epitaxy produced using conventional practices and FIG. 12B is a map of a wafer without a back surface seal after epitaxy produced in accordance with the present invention.
Figure 12B:
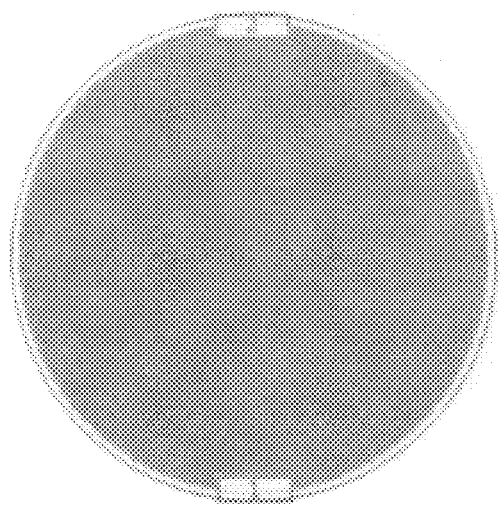

Referring now to FIG. 12A, a Tencor® SP1 haze map clearly indicates the location of the back surface halo caused by depositing an epitaxial silicon layer using a conventional susceptor on a wafer without a back surface oxide seal. In contrast, FIG. 12B indicates that using the perforated susceptor of the present invention eliminates halo without the use of a back surface oxide seal.

Figure 13A:
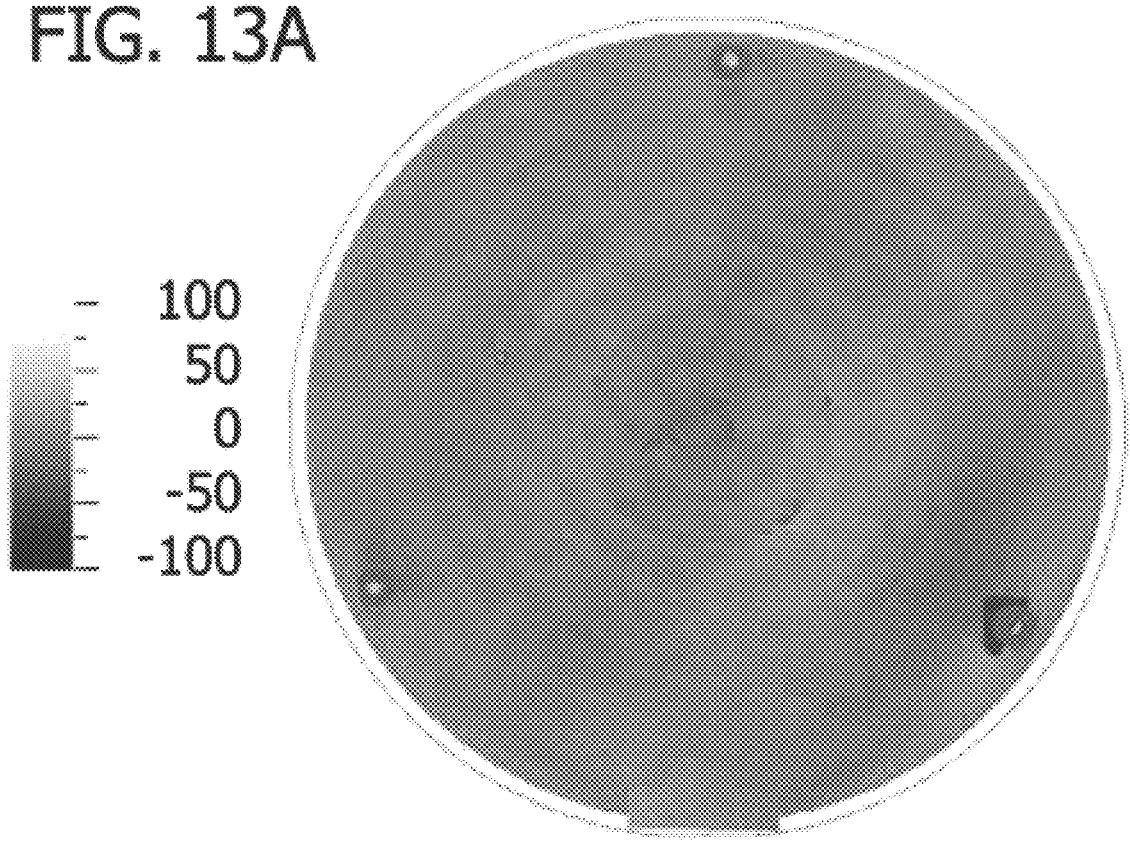
FIG. 13A is a map of a wafer produced using a conventional susceptor and FIG. 13B is a map of a wafer produced using a perforated susceptor.
Figure 13B:
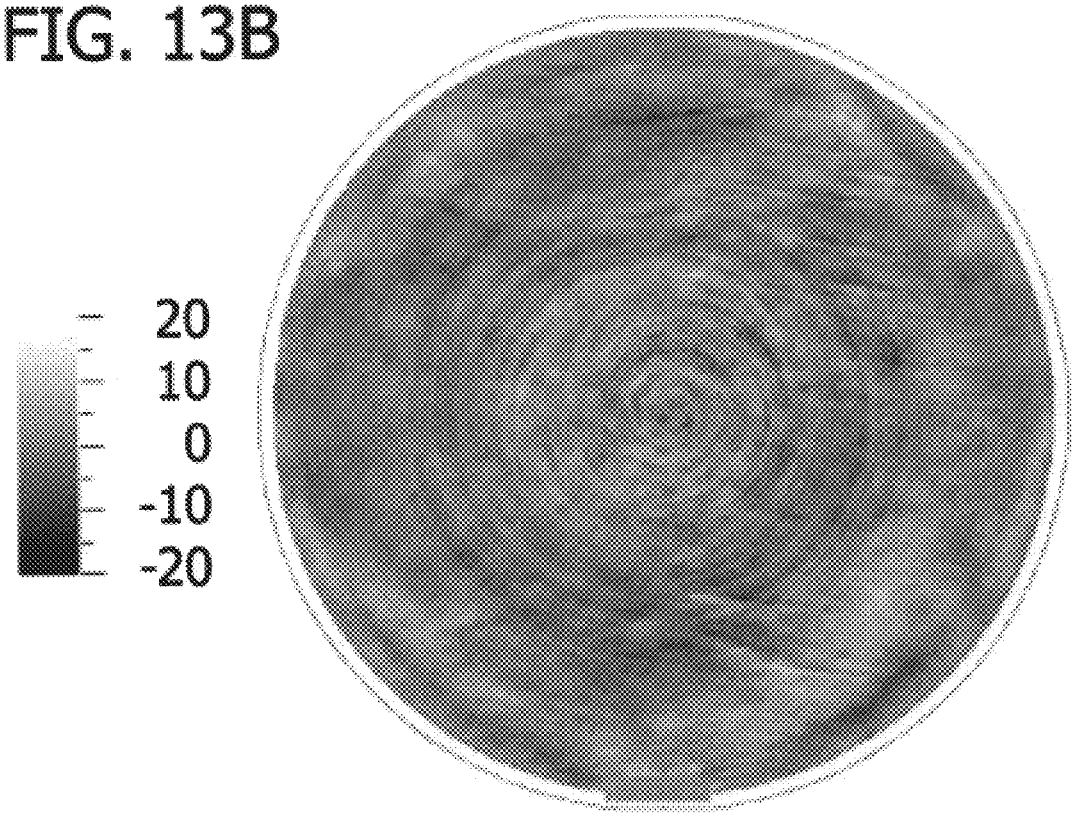

Referring now to FIG. 13A, the ADE® CR-83 SQM nanotopography map clearly indicates that using a conventional susceptor results in the epitaxial layer directly above the lift pin holes having a nanotopography of about 60 nm. In contrast, FIG. 13B, indicates that using the perforated susceptor substantially reduces the nanotopography of the epitaxial layer above the lift pin holes to less than about 20 nm.

Three embodiments of the perforated susceptor with varying hole size, spacing and density were evaluated for supporting 200 mm diameter silicon wafers during the epitaxial deposition process. Each embodiment had approximately equidistant holes drilled perpendicularly through the bottom to form a cylindrical pattern of holes with a radius of about 95 millimeters. The number and size of the holes was varied as follows: perforated susceptor A comprised 274 holes having a diameter of about 1.32 mm (hole density of about 0.95 holes/cm$^2$); perforated susceptor B comprised 548 holes having a diameter of about 1.32 mm (hole density of about 1.95 holes/cm$^2$); perforated susceptor C comprised 274 holes having a diameter of about 1.02 mm (hole density of about 0.95 holes/cm$^2$). Each embodiment also had three lift pin holes with a diameter of about 8 mm, drilled at approximately 90 mm from the center of the susceptor and spaced about 120° apart.

Numerous silicon wafers with silicon epitaxial layers were produced using the foregoing perforated susceptors. Each of the wafers were free of back surface halo and autodoping on the front surface. Results to date suggest that there is no advantage with respect to halo or autodoping between the different hole densities. However, decreased nanotopography on the epitaxial silicon wafer surface was observed on the wafers produced using susceptor C, the susceptor with the smaller diameter holes. Specifically, wafers with about a 3 μm thick epitaxial layer grown using susceptors A and B exhibited a nanotopography on the surface directly above the holes of about 20 nm and wafers produced using susceptor C exhibited a nanotopography of about 10 nm or less.

I. Intrinsic Gettering Single Crystal Silicon Wafers

As discussed above, a wafer prepared using the Czochralski method typically has an oxygen concentration of about 10 to about 18 ppm. In addition, depending on the cooling rate of the single crystal silicon ingot from the melting point of silicon (i.e., about 1410° C.) through the range of about 750° C. to about 350° C., oxygen precipitate nucleation centers may form. Thermal treatment cycles typically employed in the fabrication of electronic devices can also cause the precipitation of oxygen in silicon wafers which are supersaturated in oxygen. Depending on their location in the wafer, the precipitates can be harmful or beneficial. Oxygen precipitates located in the active device region of the wafer (i.e., typically near the surface) can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes have included a series of steps which were designed to produce silicon having a region near the surface of the wafer which is free of oxygen precipitates (commonly referred to as a "denuded zone" or a "precipitate-free zone") with the balance of the wafer (i.e., the wafer bulk) containing a sufficient number of oxygen precipitates for IG purposes. Denuded zones have been formed, for example, in a high-low-high thermal sequence such as (a) oxygen out-diffusion heat treatment at a high temperature (>1100° C.) in an inert gas for a period of at least about 4 hours, (b) oxygen precipitate nuclei formation at a low temperature (600 to 750° C.), and (c) growth of oxygen (SiO$_2$) precipitates at a high temperature (1000 to 1150° C.). See, e.g., F. Shimura, *Semiconductor Silicon Crystal Technology*, pp. 361–367 (Academic Press, Inc., San Diego Calif., 1989) (and the references cited therein).

More recently, however, advanced electronic device manufacturing processes, such as DRAM manufacturing processes, have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, IG potential is lost.

The present invention, however, allows for the formation of a template of crystal lattice vacancies within the wafer, which causes an ideal, non-uniform depth distribution of oxygen precipitates to form within the wafer when the wafer is heat-treated (see WO 00/34999 published on Jun. 15, 2000 which is incorporated herein for all purposes). Typically, the decision as to whether a template of crystal lattice vacancies is formed is based in part on the composition of the wafer substrate. Specifically, boron enhances oxygen precipitation, and as a result, heavily-doped P-type substrates (e.g., P$^+$ and P$^{++}$ substrates) form enough oxygen precipitates that formation of a template is typically unnecessary whereas lightly-doped P-Type substrates (e.g., P$^-$ substrates) typically require the formation of a template for IG purposes.

Figure 14:
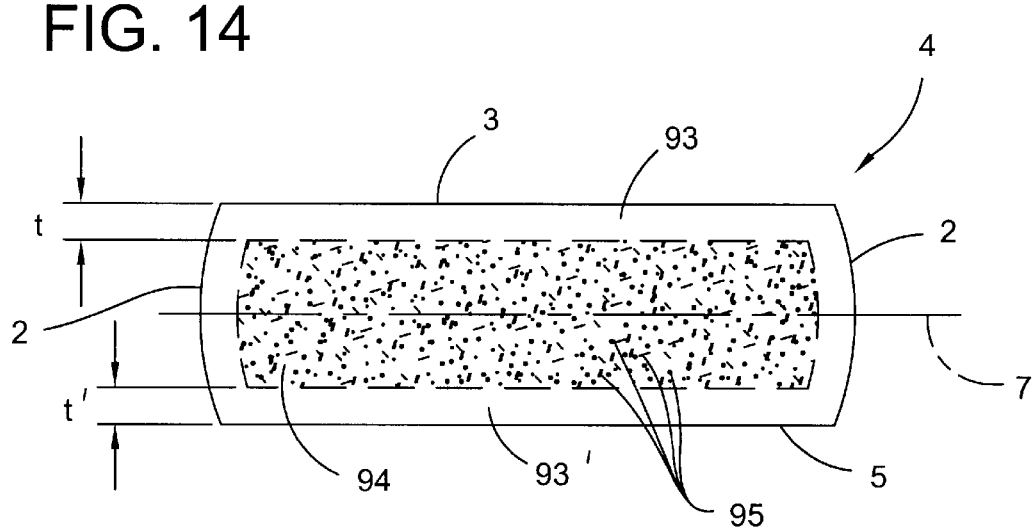
FIG. 14 shows an oxygen precipitate profile of a wafer which may be prepared in accordance with a preferred embodiment of the instant invention.

FIG. 14 shows one such oxygen precipitate distribution which may be formed by heat-treating a wafer prepared in accordance with this invention. In this particular embodiment, the wafer substrate 4 (with or without an epitaxial layer deposited on front surface 3) is characterized by regions 93 and 93' ("denuded zones") which are free of oxygen precipitates 95. These zones extend from the front surface 3 and back surface 5 to a depth of t and t', respectively. Preferably, t and t' are each from about 10 to about 100 μm, and more preferably from about 50 to about 100 μm. Between the oxygen precipitate-free regions 93 and 93', there is a region 94 which contains a substantially uniform concentration of oxygen precipitates. For most applications, the oxygen precipitate concentration in region 94 is at least about $5 \times 10^8$ precipitates/cm$^3$, and more preferably is about $1 \times 10^9$ precipitates/cm$^3$. It should be recognized that the purpose of FIG. 14 is to help acquaint those skilled in the art with this invention by illustrating merely one embodiment of this invention. This invention is not limited to that embodiment. For example, this invention may also be used to form a wafer having only one denuded zone 93 (instead of two denuded zones 93 and 93').

To form the template of crystal lattice vacancies, the wafer generally is first heated and then cooled at a rate of at least about 10° C./sec. The purpose of heating the wafer is to: (a) form self-interstitial and vacancy pairs (i.e., Frenkel defects) in the crystal lattice which are distributed uniformly throughout the wafer, and (b) dissolve unstabilized oxygen precipitate nucleation centers present in the wafer. Generally, heating to greater temperatures results in a greater number of Frenkel defects being formed. The purpose of the cooling step is to produce a non-uniform distribution of crystal lattice vacancies, wherein the vacancy concentration is maximum at or near the center of the wafer, and decreases in the direction of the surfaces of the wafer. This non-uniform distribution of crystal lattice vacancies is believed to be caused by the fact that a portion of vacancies near the surfaces of the wafer diffuse to the surfaces during the cool down and thereby become annihilated, resulting in lower concentrations of vacancies near the surfaces.

For most applications, the wafer preferably is heated to a soak temperature of at least about 1175° C. More preferably, it is heated to a soak temperature of from about 1200 to about 1300° C., and most preferably from about 1225 to about 1250° C. When the temperature of the wafer reaches the desired soak temperature, the wafer temperature preferably is held at the soak temperature for a period of time. The preferred amount of time generally is from about 10 to about 15 seconds. In a typical presently commercially available epitaxial deposition reactor, the wafer preferably is held at the soak temperature for about 12 to about 15 seconds. In a typical presently commercially available RTA furnace, on the other hand, the wafer preferably is held at the soak temperature for about 10 seconds.

Typically, the wafer is heated while exposed to an atmosphere. In one embodiment of this invention, the atmosphere is an oxidizing atmosphere that comprises $H_2O$ and $H_2$. More preferably, however, the oxidant in the oxidizing atmosphere is oxygen gas, which is present in the atmosphere at a concentration of at least about 300 ppm (i.e., 300 moles of $O_2$ per 1,000,000 moles of total gas). More preferably, the oxygen concentration is from about 300 to about 2000 ppm, and most preferably from about 300 to about 500 ppm. The remainder of the oxidizing atmosphere preferably consists essentially of a gas which will not react with the silicon surface or the oxidant. More preferably, the remainder of the gas consists essentially of a noble gas or $N_2$, more preferably a noble gas, and most preferably Ar. The oxidizing atmosphere preferably is exposed to at least the epitaxial surface during the heating. More preferably, the oxidizing atmosphere is exposed to essentially the entire surface of the wafer.

In another embodiment of this invention, the atmosphere is essentially free of oxidant. When forming the template of crystal lattice vacancies in an epitaxial reactor (described below), an atmosphere essentially free of oxidant is preferred, despite a tendency to form a surface haze on the wafer, because of safety considerations (avoiding an explosion) and the generation of particles that occurs when oxidant and unreacted chlorosilanes come into contact. The atmosphere essentially free of oxidant may comprise a reducing gas (e.g., $H_2$) and/or an inert gas (e.g., noble gasses such as He, Ne, Ar, Kr and Xe). Preferably, the atmosphere consists essentially of $H_2$, Ar and mixtures thereof.

Following the heat treatment of the wafer in the oxidizing atmosphere, the wafer is rapidly cooled. This cooling step may conveniently be carried out in the same atmosphere in which the heat-treatment is conducted. Alternatively, it preferably is carried out in an atmosphere that will not react with the wafer surface. Preferably, the wafer is cooled at a rate of at least about 10° C./sec. More preferably, the wafer is cooled at a rate of at least about 15° C./second, even more preferably at least about 20° C./second, and most preferably at least about 50° C./second. This rapid cooling rate preferably is used as the temperature of the wafer decreases through the range of temperatures at which crystal lattice vacancies diffuse through the single crystal silicon. Once the wafer is cooled to a temperature outside the range of temperatures at which crystal lattice vacancies are relatively mobile, the cooling rate does not significantly influence the precipitating characteristics of the wafer, and, thus, is not narrowly critical. Generally, crystal lattice vacancies are relatively mobile at temperatures greater than about 1000° C.

In a particularly preferred embodiment, the average cooling rate of the wafer is at least about 10° C./second (more preferably at least about 15° C./second, still more preferably at least about 20° C./second, and most preferably at least about 50° C./second) as its temperature falls from the soak temperature to a temperature which is about 150° C. less than the soak temperature. In another particularly preferred embodiment, the average cooling rate of the wafer is at least about 10° C./second (more preferably at least about 15° C./second, still more preferably at least about 20° C./second, and most preferably at least about 50° C./second) as its temperature falls from the soak temperature to a temperature which is about 250° C. less than the soak temperature.

The heating and rapid cool-down may be carried out, for example, in any of a number of commercially available rapid thermal annealing ("RTA") furnaces in which wafers are heated by banks of high power lamps. RTA furnaces are capable of rapidly heating a silicon wafer. For example, many are capable of heating a wafer from room temperature to 1200° C. in a few seconds. Examples of suitable commercially available furnaces include the model 610 furnace from AG Associates (Mountain View, Calif.) and the CENTURA® RTP from Applied Materials (Santa Clara, Calif.).

Figure 15:
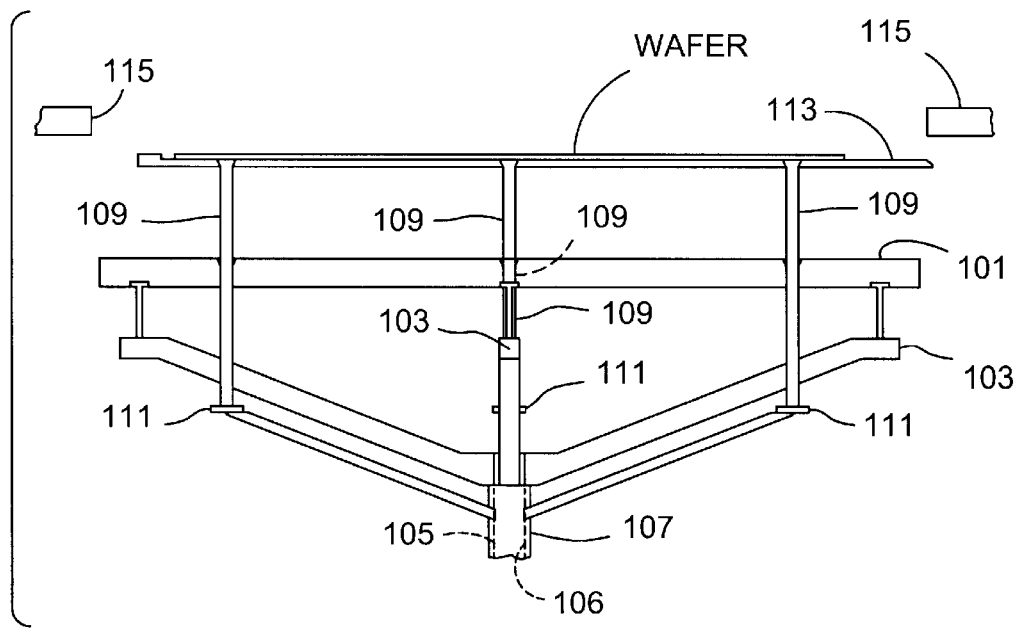
FIG. 15 is a schematic diagram of the mechanism used in an EPI CENTURA® reactor (Applied Materials, Santa Clara, Calif.) for positioning a wafer within the reactor. In this figure, the susceptor support shaft 105 and wafer lift shaft 107 are in the exchange position.
Figure 19:
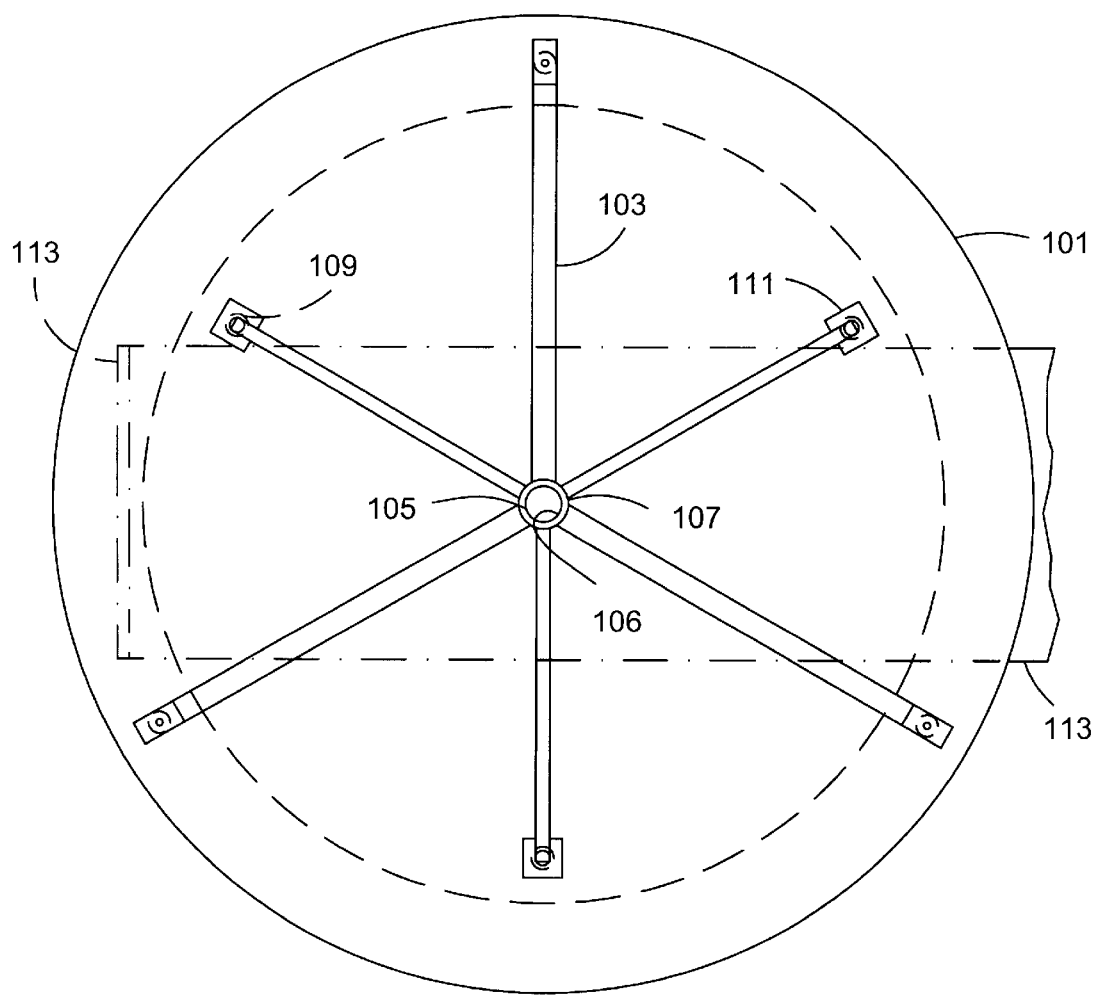
FIG. 19 is a top view of the mechanism used in an EPI CENTURA® reactor for positioning a wafer within the reactor of FIG. 15.

Alternatively, the heating and rapid cool-down may be carried out in an epitaxial deposition reactor, provided that the desired cooling rate can be achieved in the reactor. Applicants have determined that the heating and cooling steps can be carried out in an EPI CENTURA® reactor. Referring to FIG. 15 and FIG. 19, such a reactor includes a susceptor 101 for supporting a wafer. The susceptor 101 is fixedly mounted on arms 103 of a susceptor support shaft 105 slidingly mounted within a bore 106 of a wafer lift shaft 107. The wafer lift shaft is mounted for vertical movement within a cylindrical opening in a lower dome (not shown) of the reactor. A pneumatic mechanism (not shown) is operable to move the susceptor support shaft 105 and the wafer lift shaft 107 vertically, either together or independently as desired. The mechanism is further operable to rotate the susceptor support shaft 105 within the bore 106 so that the susceptor 101 and wafer may be rotated. The susceptor includes rigid pins 109 slidingly mounted in openings in the susceptor to engage stops 111 of the wafer lift shaft at their lower ends. The upper ends of the pins 109 are capable of supporting the wafer. Conventionally, the pins 109 have only been used to support the wafer during transfer to and from the reactor.

Figure 16:
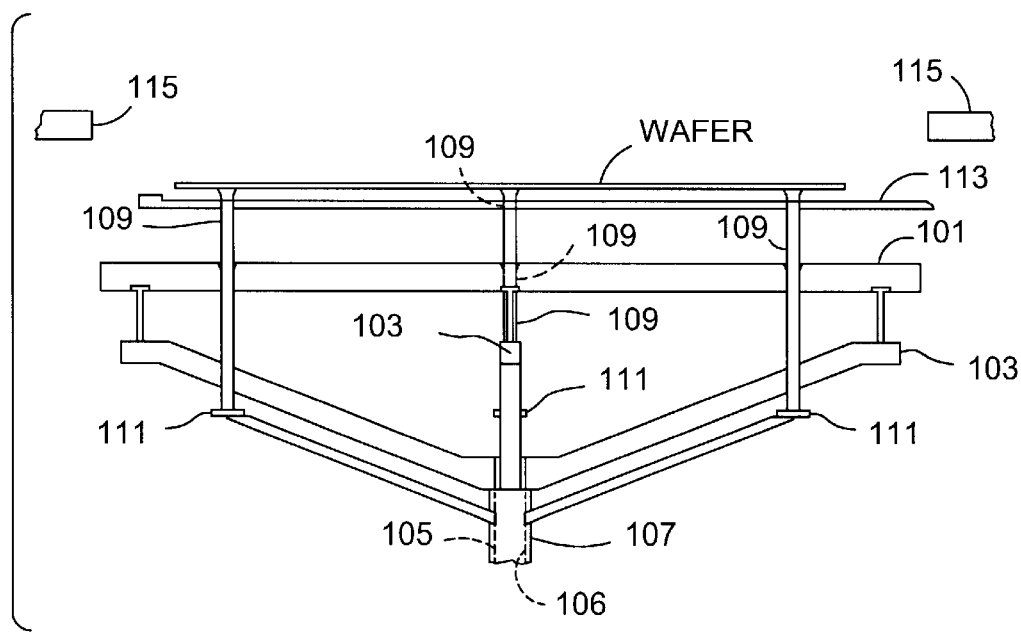
FIG. 16 is a schematic diagram of the mechanism used in an EPI CENTURA® reactor for positioning a wafer within the reactor, wherein the susceptor support shaft 105 and wafer lift shaft 107 are in the home position.
Figure 17:
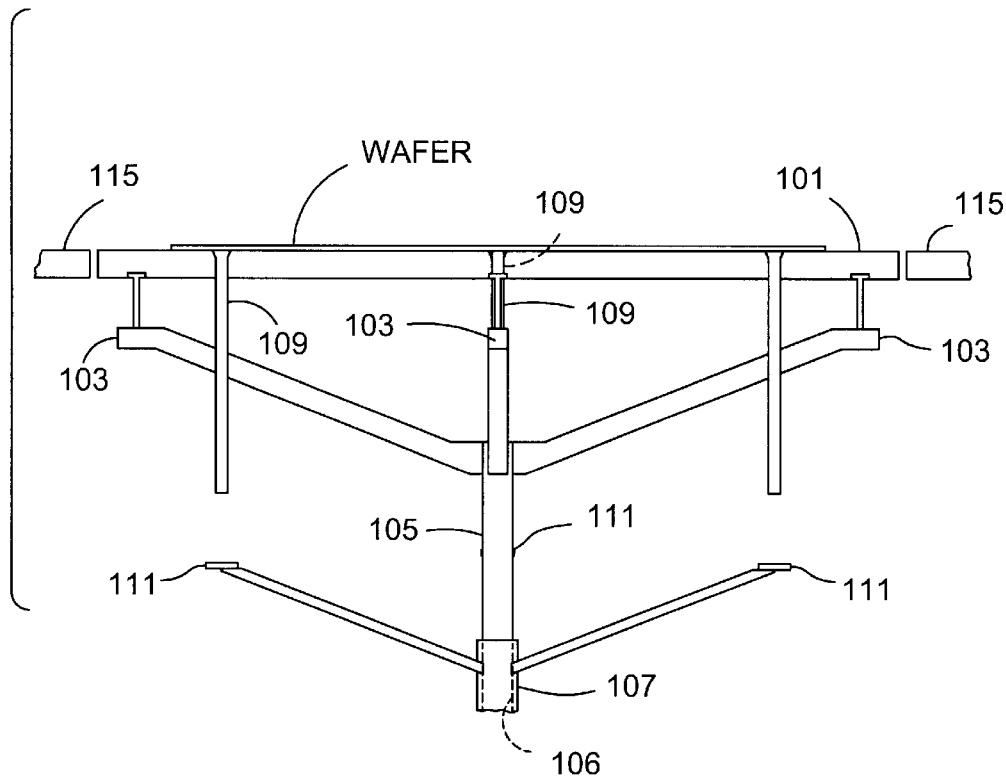
FIG. 17 is a schematic diagram of the mechanism used in an EPI CENTURA® reactor for positioning a wafer within the reactor. In this figure, the susceptor support shaft 105 and wafer lift shaft 107 are in the process position.

To position the wafer for heat-treatment in the EPI CENTURA® reactor, the wafer is delivered to the reactor, such as by blade 113, which is sized to fit between the rigid pins 109 (see FIG. 19). The susceptor support shaft 105 and wafer lift shaft 107 are moved upward from the exchange position shown in FIG. 15 to the home position shown in FIG. 16. The upward motion of the susceptor support shaft 105 causes the pins 109 (which are engaged with the wafer lift shaft 107) to engage the back surface of the wafer and lift the wafer off of the blade 113. The blade is thereafter removed from the reactor. Referring to FIG. 17, the susceptor support shaft 105 is then moved further upward while the wafer lift shaft 107 remains stationary. This causes the pins 109 to slide downwardly relative to the susceptor 101 until the upper surface of the susceptor 101 is brought into contact with the wafer. Thereafter, the susceptor 101 supports the wafer. Meanwhile, the support shaft 105 continues to move upward until the susceptor 101 is coplanar with ring 115. At this point, the susceptor is in the process position. A bank of high power lamps (not shown) is then activated to heat the wafer while it is supported by the susceptor 101 in the process position. Preferably, the susceptor 101 and wafer are rotated while being heated so that the wafer is heated more uniformly.

Figure 18:
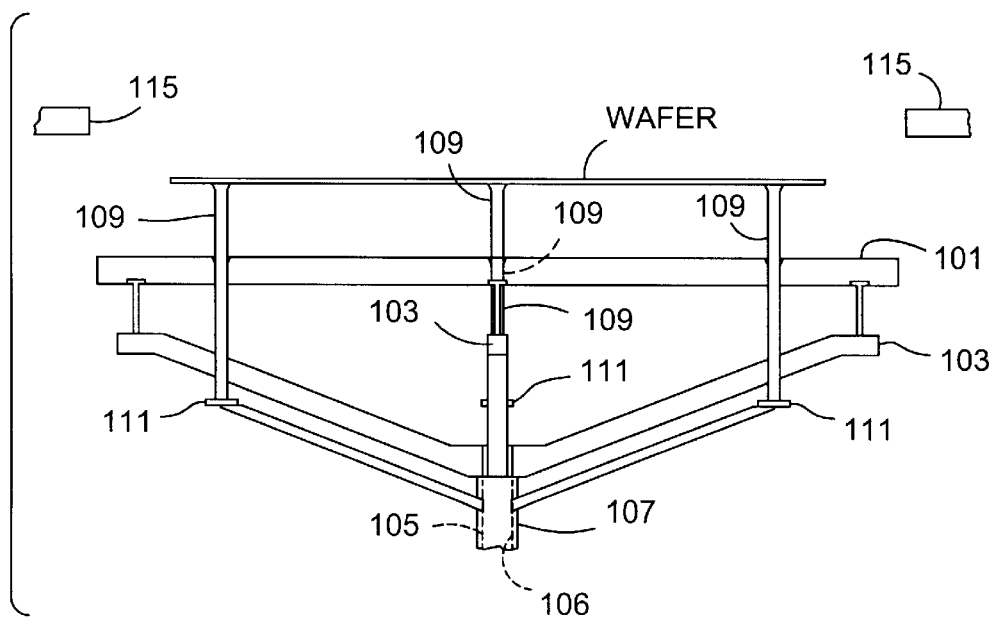
FIG. 18 is a schematic diagram of the mechanism used in an EPI CENTURA® reactor for positioning a wafer within the reactor. This figure shows the preferred position of the susceptor support shaft 105 and wafer lift shaft 107 when the wafer is being rapidly cooled in accordance with this invention to influence the crystal lattice vacancy profile in the wafer.

It has been found that the typical average cooling rate (i.e., about 10 to 15° C./second) of a wafer in the EPI CENTURA® reactor tends to be far less than the typical average cooling rate (i.e., about 70 to 100° C./second) that may be achieved in an RTA furnace at temperatures where crystal lattice vacancies are relatively mobile. This is, in part, due to the fact that the susceptor 101 (see FIG. 17), which is in contact with the wafer, remains hot for some time after heating is completed. To increase the cooling rate, therefore, the wafer preferably is moved to a position as far as possible from the susceptor 101. This may be accomplished by lowering the susceptor support shaft 105 to the exchange position shown in FIG. 18 immediately after heating is complete. In the exchange position, the wafer is supported only by the pins 109, so that substantially all the back surface and all the front surface of the wafer are not in contact with any other solid hot surfaces (besides the pins 109). Further, the wafer is positioned as far as possible from the hot susceptor 101. By lifting the wafer off of the susceptor 101, the rate of cooling of the wafer may be approximately doubled (i.e., the average rate of cooling increases from a range of from about 10 to 15° C./second to a range of from about 25 to about 30° C./second).

In an alternative embodiment, the desired cooling rate can be achieved in an epitaxial deposition reactor which comprises an open back side wafer support device such as the pin support or ring support described above. By using an open back side wafer support device the insulating effect of a susceptor is eliminated and the wafer can be heated and cooled more rapidly. Specifically, in contrast to a wafer supported on lift pins above a susceptor which typically cools at a rate of about 25 to about 30° C./second, a wafer on a pin support or ring support typically cools at a rate of about 70 to about 100° C./second. An open back side wafer support device may be preferred because the thermal processing to create the denuded zone can be integrated into the epitaxial deposition process without the additional physical contact of lifting the wafer on pins which could impart damage to the wafer.

The non-uniform vacancy profile prepared in accordance with this invention is a template for oxygen precipitation when the wafer is subsequently heated. Specifically, when the wafer substrate 4 (see FIG. 14) is heated, oxygen will cluster rapidly to form precipitates 95 in the region 94 of the wafer substrate 4 containing higher concentrations of vacancies, but will tend not to cluster in the regions 93 and 93' near the wafer surfaces 3 and 5 which contain lower concentrations of vacancies. Typically, the oxygen nucleates at temperatures of from about 500 to about 800° C., and grows precipitates at temperatures of from about 700 to about 1000° C. Thus, for example, the non-uniform distribution of oxygen precipitates 95 in a wafer may be formed during a heat treatment cycle of an electronic device manufacturing process, given that such heat treatment cycles often are conducted at temperatures near 800° C.

The formation of the template of crystal lattice vacancies within the wafer and the subsequent oxygen precipitation may be performed at any point during the wafer and/or device manufacturing process provided later processing steps do not annihilate the oxygen precipitate nucleation centers/oxygen precipitates (e.g., a subsequent heating of the wafer to a sufficient temperature over a period of time short enough to dissolve nucleation centers/oxygen precipitates into the silicon). In one preferred embodiment of the present invention the formation of the template of crystal lattice vacancies and the nucleation centers/oxygen precipitates occurs after the epitaxial layer is deposited. For example, as discussed above, the template of crystal lattice vacancies are formed during the wafer manufacturing process after epitaxial deposition and the nucleation/precipitation is performed during a heat treatment cycle of an electronic device manufacturing process. In another embodiment, the formation of the template of crystal lattice vacancies and the nucleation centers/oxygen precipitates occurs prior to deposition of the epitaxial layer. The nucleation centers/precipitates are formed by heating the wafer to a temperature for a duration sufficient to grow nucleation centers/precipitates large enough to survive any subsequent heat treatment (i.e., the radius of the nucleation centers/precipitates is greater than the "critical radius").

In view of the above, it will be seen that the several objects of the invention are achieved. As various changes could be made in the above-described perforated susceptor without departing from the scope of the invention, it is intended that all matter contained in the above description be interpreted as illustrative and not in a limiting sense.

What is claimed is:

1. A single crystal silicon wafer, the single crystal silicon wafer comprising:

a silicon wafer substrate having a central axis, a front surface and a back surface which are generally perpendicular to the central axis, a circumferential edge, and a radius extending from the central axis to the circumferential edge of the wafer, the back surface being free of an oxide seal and substantially free of a chemical vapor deposition process induced halo, the silicon wafer substrate comprising P-type or N-type dopant atoms; and an epitaxial silicon layer on the front surface of the silicon wafer substrate characterized by an axially symmetric region extending radially outwardly from the central axis toward the circumferential edge wherein the resistivity is substantially uniform, the radius of the axially symmetric region being at least about 80% of the length of the radius of the substrate, the epitaxial silicon layer comprising P-type or N-type dopant atoms.

2. The single crystal silicon wafer as set forth in claim 1 wherein the front surface and the back surface have specular gloss.

3. The single crystal silicon wafer as set forth in claim 1 wherein the resistivity of the axially symmetric region varies less than about 10%.

4. The single crystal silicon wafer as set forth in claim 1 wherein the resistivity of the axially symmetric region varies less than about 5%.

5. The single crystal silicon wafer as set forth in claim 1 wherein the resistivity of the axially symmetric region varies less than about 2%.

6. The single crystal silicon wafer as set forth in claim 1 wherein the radius of the axial symmetric region is at least about 85% of the length of the radius of the silicon wafer substrate.

7. The single crystal silicon wafer as set forth in claim 1 wherein the radius of the axial symmetric region is at least about 90% of the length of the radius of the silicon wafer substrate.

8. The single crystal silicon wafer as set forth in claim 1 wherein the radius of the axial symmetric region is at least about 95% of the length of the radius of the silicon wafer substrate.

9. The single crystal silicon wafer as set forth in claim 1 wherein the radius of the axial symmetric region is about 100% of the length of the radius of the silicon wafer substrate.

10. The single crystal silicon wafer as set forth in claim 1 wherein the radius of the silicon wafer substrate is at least about 50 mm.

11. The single crystal silicon wafer as set forth in claim 1 wherein the radius of the silicon wafer substrate is at least about 75 mm.

12. The single crystal silicon wafer as set forth in claim 1 wherein the radius of the silicon wafer substrate is at least about 100 mm.

13. The single crystal silicon wafer as set forth in claim 1 wherein the radius of the silicon wafer substrate is at least about 150 mm.

14. The single crystal silicon wafer as set forth in claim 1 wherein the epitaxial silicon layer is about 0.1 $\mu$m to about 200 $\mu$m thick.

15. The single crystal silicon wafer as set forth in claim 1 wherein the epitaxial silicon layer is about 1 $\mu$m to about 100 $\mu$m thick.

16. The single crystal silicon wafer as set forth in claim 1 wherein the epitaxial silicon layer is about 2 $\mu$m to about 30 $\mu$m thick.

17. The single crystal silicon wafer as set forth in claim 1 wherein the epitaxial silicon layer is about 3 $\mu$m thick.

18. The single crystal silicon wafer as set forth in claim 14 wherein the epitaxial silicon layer is characterized by a 0.5 mm×0.5 mm nanotopography that is less than about 1% of the thickness of the epitaxial silicon layer.

19. The single crystal silicon wafer as set forth in claim 14 wherein the epitaxial silicon layer is characterized by a 0.5 mm×0.5 mm nanotopography that is less than about 0.7% of the thickness of the epitaxial silicon layer.

20. The single crystal silicon wafer as set forth in claim 14 wherein the epitaxial silicon layer is characterized by a 0.5 mm×0.5 mm nanotopography that is less than about 0.3% of the thickness of the epitaxial silicon layer.

21. The single crystal silicon wafer as set forth in claim 14 wherein the epitaxial silicon layer is characterized by a 2 mm×2 mm nanotopography that is less than about 1% of the thickness of the epitaxial silicon layer.

22. The single crystal silicon wafer as set forth in claim 14 wherein the epitaxial silicon layer is characterized by a 2 mm×2 mm nanotopography that is less than about 0.7% of the thickness of the epitaxial silicon layer.

23. The single crystal silicon wafer as set forth in claim 14 wherein the epitaxial silicon layer is characterized by a 2 mm×2 mm nanotopography that is less than about 0.3% of the thickness of the epitaxial silicon layer.

24. The single crystal silicon wafer as set forth in claim 14 wherein the epitaxial silicon layer is characterized by a 10 mm×10 mm nanotopography that is less than about 3% of the thickness of the epitaxial silicon layer.

25. The single crystal silicon wafer as set forth in claim 17 wherein the epitaxial silicon layer is characterized by a 2 mm×2 mm nanotopography that is less than about 60 nm.

26. The single crystal silicon wafer as set forth in claim 17 wherein the epitaxial silicon layer is characterized by a 2 mm×2 mm nanotopography that is less than about 40 nm.

27. The single crystal silicon wafer as set forth in claim 17 wherein the epitaxial silicon layer is characterized by a 2 mm×2 mm nanotopography that is less than about 20 nm.

28. The single crystal silicon wafer as set forth in claim 17 wherein the epitaxial silicon layer is characterized by a 2 mm×2 mm nanotopography that is less than about 10 nm.

29. The single crystal silicon wafer as set forth in claim 1 wherein the silicon wafer substrate and the silicon epitaxial layer have an electrical resistivity of about 100 $\Omega$-cm to about 0.005 $\Omega$-cm.

30. The single crystal silicon wafer as set forth in claim 1 wherein the silicon wafer substrate has an electrical resistivity of about 0.01 $\Omega$-cm to about 0.03 $\Omega$-cm and the epitaxial silicon layer has an electrical resistivity of about 1 $\Omega$-cm to about 20 $\Omega$-cm.

31. The single crystal silicon wafer as set forth in claim 1 wherein the silicon wafer substrate has an electrical resistivity of about 0.005 $\Omega$-cm to about 0.01 $\Omega$-cm and the epitaxial silicon layer has an electrical resistivity of about 1 $\Omega$-cm to about 20 $\Omega$-cm.

32. The single crystal silicon wafer as set forth in claim 1 wherein the silicon wafer substrate further comprises a central plane between and parallel to the front and back surfaces; a front surface layer which comprises the region of the wafer extending a distance, $D_1$, of at least about 10 $\mu$m from the front surface toward the central plane; and a bulk layer which comprises the region of the wafer extending from the central plane to the front surface layer, the wafer substrate being characterized in that:

the wafer substrate has a non-uniform distribution of crystal lattice vacancies wherein (a) the bulk layer has a crystal lattice vacancy concentration which is greater than in the front surface layer, (b) the crystal lattice vacancies have a concentration profile having a peak density of crystal lattice vacancies at or near the central plane, and (c) the concentration of crystal lattice vacancies generally decreases from the position of peak density toward the front surface of the wafer.

33. The single crystal silicon wafer of claim 32 wherein $D_1$ is from about 50 to about 100 $\mu$m.

34. The single crystal silicon wafer as set forth in claim 1 wherein the silicon wafer substrate further comprises a central plane between and parallel to the front and back surfaces; a front surface layer which comprises the region of the wafer extending a distance, $D_1$, of at least about 10 μm from the front surface toward the central plane; and a bulk layer which comprises the region of the wafer extending from the central plane to the front surface layer, the wafer substrate being characterized in that:

the wafer substrate has a non-uniform distribution of oxygen precipitates wherein (a) the bulk layer has a oxygen precipitate concentration which is greater than in the front surface layer, (b) the oxygen precipitates have a concentration profile having a peak density of oxygen precipitates at or near the central plane, and (c) the concentration of oxygen precipitates generally decreases from the position of peak density toward the front surface of the wafer.

35. The single crystal silicon wafer of claim 34 wherein $D_1$, is from about 50 to about 100 μm.

* * * * *

UNITED STATES PATENT AND TRADEMARK OFFICE
CERTIFICATE OF CORRECTION

PATENT NO. : 6,596,095 B2
DATED : July 22, 2003
INVENTOR(S) : Michael J. Ries et al.

It is certified that error appears in the above-identified patent and that said Letters Patent is hereby corrected as shown below:

Column 6,
Line 41, "$2x10_{19}$" should read -- $2x10^{19}$ --.

Column 16,
Line 37, "inert has below" should read -- inert gas below --.
Line 41, "30 comprises an edge ring" should read -- 30 also comprises chamber dividers 75 and 76 to enhance the separation of the deposition gas from purge gas. Also, the epitaxial deposition chamber 30 comprises an edge ring --.

Column 24,
Line 63, "$D_1$, is" should read -- $D_1$ is --.

Column 26,
Line 7, "$D_1$, is" should read -- $D_1$ is --.

Signed and Sealed this

Eleventh Day of November, 2003

JAMES E. ROGAN
*Director of the United States Patent and Trademark Office*